United States Patent
Chuang et al.

(10) Patent No.: US 11,719,652 B2
(45) Date of Patent: Aug. 8, 2023

(54) SEMICONDUCTOR METROLOGY AND INSPECTION BASED ON AN X-RAY SOURCE WITH AN ELECTRON EMITTER ARRAY

(71) Applicant: KLA Corporation, Milpitas, CA (US)

(72) Inventors: Yung-Ho Alex Chuang, Cupertino, CA (US); John Fielden, Los Altos, CA (US)

(73) Assignee: KLA Corporation, Milpitas, CA (US)

( * ) Notice: Subject to any disclaimer, the term of this patent is extended or adjusted under 35 U.S.C. 154(b) by 67 days.

(21) Appl. No.: 17/160,006

(22) Filed: Jan. 27, 2021

(65) Prior Publication Data

US 2021/0239629 A1    Aug. 5, 2021

Related U.S. Application Data

(60) Provisional application No. 62/970,114, filed on Feb. 4, 2020.

(51) Int. Cl.
*G01N 23/20008* (2018.01)
*G01N 23/201* (2018.01)
(Continued)

(52) U.S. Cl.
CPC ..... *G01N 23/20008* (2013.01); *G01N 23/201* (2013.01); *G03F 7/70633* (2013.01);
(Continued)

(58) Field of Classification Search
None
See application file for complete search history.

(56) References Cited

U.S. PATENT DOCUMENTS 2,036,532 A * 4/1936 Stoerk ................... H01J 31/121
                                                    348/844
3,665,241 A * 5/1972 Spindt ..................... H01T 23/00
                                                     313/309

(Continued)

FOREIGN PATENT DOCUMENTS

CN      101283432 A * 10/2008 ............. H01J 35/04
JP        2008091190      4/2008
(Continued)

OTHER PUBLICATIONS

Lemaillet, Germer, Kline et al.,"Intercomparison between optical and x-ray scatterometry measurements of FinFET structures" by Proc. SPIE, v.8681, p. 86810Q (2013).

(Continued)

*Primary Examiner* — Thomas R Artman
(74) *Attorney, Agent, or Firm* — Spano Law Group; Joseph S. Spano

(57) ABSTRACT

Methods and systems for realizing a high radiance x-ray source based on a high density electron emitter array are presented herein. The high radiance x-ray source is suitable for high throughput x-ray metrology and inspection in a semiconductor fabrication environment. The high radiance X-ray source includes an array of electron emitters that generate a large electron current focused over a small anode area to generate high radiance X-ray illumination light. In some embodiments, electron current density across the surface of the electron emitter array is at least 0.01 Amperes/$mm^2$, the electron current is focused onto an anode area with a dimension of maximum extent less than 100 micrometers, and the spacing between emitters is less than 5 micrometers. In another aspect, emitted electrons are accelerated from the array to the anode with a landing energy less than four times the energy of a desired X-ray emission line.

34 Claims, 7 Drawing Sheets

(51) Int. Cl.
*H01J 35/06* (2006.01)
*H01J 35/14* (2006.01)
*H01J 35/18* (2006.01)
*H01J 3/02* (2006.01)
*H05G 1/02* (2006.01)
*G03F 7/20* (2006.01)
*G03F 7/00* (2006.01)

(52) U.S. Cl.
CPC ............ *H01J 3/022* (2013.01); *H01J 35/065* (2013.01); *H01J 35/066* (2019.05); *H01J 35/147* (2019.05); *H01J 35/18* (2013.01); *H05G 1/02* (2013.01); *G01N 2223/03* (2013.01); *G01N 2223/054* (2013.01); *G01N 2223/1016* (2013.01); *G01N 2223/204* (2013.01); *G01N 2223/6116* (2013.01); *H01J 2235/062* (2013.01); *H01J 2235/068* (2013.01); *H01J 2235/16* (2013.01); *H01J 2235/18* (2013.01)

(56) References Cited

U.S. PATENT DOCUMENTS

| | | | |
|---|---|---|---|
| 3,755,704 A | 8/1973 | Spindt et al. | |
| 4,146,815 A | 3/1979 | Childeric | |
| 4,953,191 A | 8/1990 | Smither et al. | |
| 4,972,449 A | 11/1990 | Upadhya et al. | |
| 5,199,917 A | 4/1993 | MacDonald et al. | |
| 5,363,021 A | 11/1994 | MacDonald | |
| 5,382,867 A | 1/1995 | Yuji et al. | |
| 5,608,526 A | 3/1997 | Piwonka-Corle et al. | |
| 5,729,583 A | 3/1998 | Tang et al. | |
| 5,859,424 A | 1/1999 | Norton et al. | |
| 5,955,849 A * | 9/1999 | Tang | |
| 6,023,338 A | 2/2000 | Bareket | |
| 6,185,277 B1 | 2/2001 | Harding | |
| 6,192,107 B1 | 2/2001 | Price et al. | |
| 6,341,157 B1 | 1/2002 | Sakabe | |
| 6,429,943 B1 | 8/2002 | Opsal et al. | |
| 6,711,233 B2 | 3/2004 | Hertz et al. | |
| 6,716,646 B1 | 4/2004 | Wright et al. | |
| 6,778,275 B2 | 8/2004 | Bowes | |
| 6,787,773 B1 | 9/2004 | Lee | |
| 6,992,764 B1 | 1/2006 | Fang et al. | |
| 7,005,774 B2 | 2/2006 | Kuribayashi et al. | |
| 7,085,351 B2 * | 8/2006 | Lu ........................ | H01J 35/147 315/169.3 |
| 7,123,689 B1 | 10/2006 | Wilson | |
| 7,242,477 B2 | 7/2007 | Mieher et al. | |
| 7,321,426 B1 | 1/2008 | Poslavsky et al. | |
| 7,330,533 B2 | 2/2008 | Sampayon | |
| 7,406,153 B2 | 7/2008 | Berman | |
| 7,440,549 B2 | 10/2008 | Kerpershoek et al. | |
| 7,478,019 B2 | 1/2009 | Zangooie et al. | |
| 7,483,517 B2 | 1/2009 | Barschdorf et al. | |
| 7,518,134 B2 | 4/2009 | Ivanov et al. | |
| 7,609,815 B2 | 10/2009 | Leung et al. | |
| 7,626,702 B2 | 12/2009 | Ausschnitt et al. | |
| 7,656,528 B2 | 2/2010 | Abdulhalim et al. | |
| 7,660,392 B2 | 2/2010 | DeSalvo et al. | |
| 7,801,277 B2 * | 9/2010 | Zou ........................ | H01J 35/065 378/138 |
| 7,809,114 B2 | 10/2010 | Zou et al. | |
| 7,826,071 B2 | 11/2010 | Shchegrov et al. | |
| 7,826,594 B2 | 11/2010 | Zou et al. | |
| 7,842,933 B2 | 11/2010 | Shur et al. | |
| 7,873,585 B2 | 1/2011 | Izikson | |
| 7,929,667 B1 | 4/2011 | Zhuang et al. | |
| 7,933,026 B2 | 4/2011 | Opsal et al. | |
| 8,068,662 B2 | 11/2011 | Zhang et al. | |
| 8,138,498 B2 | 3/2012 | Ghinovker | |
| 8,155,273 B2 | 4/2012 | Eaton et al. | |
| 8,243,884 B2 | 8/2012 | Rodhammer et al. | |
| 8,565,381 B2 | 10/2013 | Sukowski et al. | |
| 8,582,722 B2 | 11/2013 | Tadokoro et al. | |
| 8,588,372 B2 * | 11/2013 | Zou ........................ | H01J 35/065 378/138 |
| 8,629,606 B2 | 1/2014 | Kakonyi | |
| 9,159,524 B2 | 10/2015 | Hovarth et al. | |
| 9,508,523 B2 | 11/2016 | Eaton et al. | |
| 9,594,036 B2 | 3/2017 | Yun et al. | |
| 9,693,439 B1 | 6/2017 | Zhuang et al. | |
| 9,715,989 B2 | 7/2017 | Dalakos et al. | |
| 9,726,624 B2 | 8/2017 | Ryan et al. | |
| 9,748,071 B2 * | 8/2017 | Guerrera ............. | H01J 37/3174 |
| 10,068,740 B2 | 9/2018 | Gupta et al. | |
| 10,133,181 B2 * | 11/2018 | Chuang | |
| 10,242,836 B2 * | 3/2019 | Iida ........................ | H01J 35/025 |
| 10,529,527 B2 | 1/2020 | Sebald | |
| 10,546,712 B2 | 1/2020 | Düsberg | |
| 10,558,123 B2 * | 2/2020 | Chuang | |
| 10,741,352 B2 * | 8/2020 | Nojeh ................... | H01J 37/075 |
| 10,748,736 B2 | 8/2020 | Zalubovsky | |
| 10,957,510 B2 * | 3/2021 | Düsberg | |
| 11,101,095 B2 * | 8/2021 | Iida ........................ | H01J 31/127 |
| 11,152,130 B2 | 10/2021 | Akinwande | |
| 2003/0021465 A1 | 1/2003 | Adel et al. | |
| 2006/0274889 A1 * | 12/2006 | Lu ........................ | H01J 35/065 378/122 |
| 2007/0221842 A1 | 9/2007 | Morokuma et al. | |
| 2009/0152463 A1 | 6/2009 | Toyoda et al. | |
| 2009/0185660 A1 * | 7/2009 | Zou ........................ | H01J 1/3048 378/138 |
| 2009/0185661 A1 * | 7/2009 | Zou | |
| 2009/0245468 A1 * | 10/2009 | Zou ........................ | H01J 35/065 313/460 |
| 2010/0002842 A1 | 1/2010 | Kerpershoek et al. | |
| 2011/0129068 A1 | 6/2011 | Lewalter et al. | |
| 2011/0142204 A1 * | 6/2011 | Zou ........................ | H01J 35/065 378/138 |
| 2011/0266440 A1 | 11/2011 | Boughorbel et al. | |
| 2012/0292502 A1 | 11/2012 | Langer et al. | |
| 2013/0208279 A1 | 8/2013 | Smith | |
| 2013/0304424 A1 | 11/2013 | Bakeman et al. | |
| 2014/0019097 A1 | 1/2014 | Bakeman et al. | |
| 2014/0111791 A1 | 4/2014 | Manassen et al. | |
| 2014/0172394 A1 | 6/2014 | Kuznetsov et al. | |
| 2014/0222380 A1 | 8/2014 | Kuznetsov et al. | |
| 2014/0297211 A1 | 10/2014 | Pandev et al. | |
| 2014/0369476 A1 | 12/2014 | Harding | |
| 2015/0032398 A1 | 1/2015 | Peterlinz et al. | |
| 2015/0051877 A1 | 2/2015 | Bakeman et al. | |
| 2015/0092923 A1 * | 4/2015 | Iida ........................ | H01J 35/04 378/138 |
| 2015/0092924 A1 | 4/2015 | Yun et al. | |
| 2015/0110249 A1 | 4/2015 | Bakeman et al. | |
| 2015/0117610 A1 | 4/2015 | Veldman et al. | |
| 2015/0124934 A1 * | 5/2015 | Gupta | |
| 2015/0204664 A1 | 7/2015 | Bringoltz et al. | |
| 2015/0300965 A1 | 10/2015 | Sezginer et al. | |
| 2015/0369759 A1 | 12/2015 | Mazor et al. | |
| 2015/0371810 A1 * | 12/2015 | Guerrera ............. | H01J 37/3007 250/396 R |
| 2016/0202193 A1 | 7/2016 | Hench et al. | |
| 2016/0320319 A1 | 11/2016 | Hench et al. | |
| 2016/0343532 A1 | 11/2016 | Chuang et al. | |
| 2017/0011880 A1 | 1/2017 | Hu | |
| 2017/0047207 A1 | 2/2017 | Chuang et al. | |
| 2017/0160212 A1 | 6/2017 | Kleine et al. | |
| 2017/0167862 A1 | 6/2017 | Dziura et al. | |
| 2018/0106735 A1 | 4/2018 | Gellineau et al. | |
| 2018/0174792 A1 * | 6/2018 | Düsberg | |
| 2018/0247785 A1 | 8/2018 | Sebald | |
| 2019/0049851 A1 | 2/2019 | Chuang | |
| 2019/0115184 A1 | 4/2019 | Zalubovsky | |
| 2019/0189383 A1 * | 6/2019 | Iida ........................ | H01J 35/16 |
| 2019/0206652 A1 * | 7/2019 | Akinwande ......... | G01N 23/041 |
| 2020/0118783 A1 | 4/2020 | Chuang et al. | |
| 2020/0144015 A1 * | 5/2020 | Düsberg | |
| 2021/0239629 A1 * | 8/2021 | Chuang ................ | G01N 23/201 |

(56) References Cited

U.S. PATENT DOCUMENTS

FOREIGN PATENT DOCUMENTS

| JP | 2016071991 | | 5/2016 | |
|---|---|---|---|---|
| KR | 10-2017-0134144 A | | 12/2017 | |
| WO | WO-9625024 A1 | * | 8/1996 | ............... A61B 6/06 |
| WO | WO-02067779 A1 | * | 9/2002 | ............. A61B 6/032 |
| WO | 2016010448 A1 | | 1/2016 | |
| WO | 2019079630 A1 | | 4/2019 | |

OTHER PUBLICATIONS

Kline et al., "X-ray scattering critical dimensional metrology using a compact x-ray source for next generation semiconductor devices," J. Micro/Nanolith. MEMS MOEMS 16(1), 014001 (Jan.-Mar. 2017).

Hemberg, et al., "Liquid-metal-jet anode electron-impact x-ray source," Applied Physics Letters, Aug. 18, 2003, vol. 83, No. 7, pp. 1483-1485.

Wang et al., "Controlled Preparation of Micron-Size-Patterned ZnO Nanowire Field Emitters", Technical Digest, 2018 31st International Vacuum Nanoelectronics Conference, Jul. 9-13, 2018, Kyoto, Japan, pp. 48-49.

Yoo et al., "High performance carbon nanotube cold cathode for x-ray and UV devices", Technical Digest, 2018 31st International Vacuum Nanoelectronics Conference, Jul. 9-13, 2018, Kyoto, Japan, pp. 78-79.

Mavalankar et al., "Controlling thermal failure of silicon field emitters in a commercial X-ray source", Technical Digest, 2018 31st International Vacuum Nanoelectronics Conference, Jul. 9-13, 2018, Kyoto, Japan, pp. 82-83.

Jeong et al., "Two applications of carbon nanotube paste emitters: nano-focus, and high-flux vacuum-sealed x-ray tubes", Technical Digest, 2018 31st International Vacuum Nanoelectronics Conference, Jul. 9-13, 2018, Kyoto, Japan, pp. 84-85.

Rughoobur et al., "Arrays of Si Field Emitter Individually Regulated by Si Nanowires", Technical Digest, 2018 31st International Vacuum Nanoelectronics Conference, Jul. 9-13, 2018, Kyoto, Japan, pp. 98-99.

Langer et al., "Field emission current investigation of p-type and metallized silicon emitters in the frequency domain", Technical Digest, 2018 31st International Vacuum Nanoelectronics Conference, Jul. 9-13, 2018, Kyoto, Japan, pp. 110-111.

Edler et al., "Influence of adsorbates on the performance of a field emitter array in a high voltage triode setup", Technical Digest, 2018 31st International Vacuum Nanoelectronics Conference, Jul. 9-13, 2018, Kyoto, Japan, pp. 118-119.

Cui et al., "Enhanced field emission properties of SiC nanotubes decorated with Au particles", Technical Digest, 2018 31st International Vacuum Nanoelectronics Conference, Jul. 9-13, 2018, Kyoto, Japan, pp. 146.

Manox Imaging Ltd., "Hot Cathodes, Cold Cathodes", pp. 1-16.

International Search Report dated May 21, 2021, for PCT Application No. PCT/US2021/015977. Filed on Feb. 1, 2021 by KLA Corporation, 3 pages.

* cited by examiner

SEMICONDUCTOR METROLOGY AND INSPECTION BASED ON AN X-RAY SOURCE WITH AN ELECTRON EMITTER ARRAY

CROSS REFERENCE TO RELATED APPLICATION

The present application for patent claims priority under 35 U.S.C. § 119 from U.S. provisional patent application Ser. No. 62/970,114, entitled "Metrology and Inspection Systems Using an X-ray Source and an X-ray Source," filed Feb. 4, 2020, the subject matter of which is incorporated herein by reference in its entirety.

TECHNICAL FIELD

The described embodiments relate to metrology systems and methods, and more particularly to methods and systems for improved x-ray illumination.

BACKGROUND INFORMATION

The various features and multiple structural levels of semiconductor devices such as logic and memory devices are typically fabricated by a sequence of processing steps applied to a specimen. For example, lithography among others is one semiconductor fabrication process that involves generating a pattern on a semiconductor wafer. Additional examples of semiconductor fabrication processes include, but are not limited to, chemical-mechanical polishing, etch, deposition, and ion implantation. Multiple semiconductor devices may be fabricated on a single semiconductor wafer and then separated into individual semiconductor devices.

Metrology processes are used at various steps during a semiconductor manufacturing process to detect defects on wafers to promote higher yield. Metrology and inspection tools must provide high sensitivity to measure small dimensions and detect small defects and particles with high throughput to be feasible in a semiconductor manufacturing environment.

To achieve high sensitivity at high throughput, metrology and inspection tools must employ high-brightness illumination sources, i.e., illumination sources having high radiance or high emitted power per unit area per unit solid angle. High radiance sources are required to focus illumination on the article being measured or inspected at high power per unit area. Under these illumination conditions, small changes in reflectivity or scattering are detected in a short time, e.g., within one millisecond, tens of milliseconds, or hundreds of milliseconds. In addition, under these illumination conditions, small changes in reflectivity or scattering indicate dimensional changes of a fraction of a nanometer or the presence of a defect or particle having nanometer scale dimensions.

Optical metrology and inspection techniques offer the potential for high throughput without the risk of sample destruction. A number of optical metrology based techniques including scatterometry and reflectometry implementations and associated analysis algorithms are commonly used to characterize critical dimensions, film thicknesses, composition and other parameters of nanoscale structures.

In some examples, lasers and laser-sustained plasmas provide high brightness optical illumination in the visible and UV portions of the spectrum. Nonetheless, optical metrology and inspection are not suitable in all situations. As devices (e.g., logic and memory devices) move toward smaller nanometer-scale dimensions, characterization becomes more difficult. Devices incorporating complex three-dimensional geometry and materials with diverse physical properties contribute to characterization difficulty. For example, modern memory structures are often high-aspect ratio, three-dimensional structures that make it difficult for optical radiation to penetrate to the bottom layers. In addition, the increasing number of parameters required to characterize complex structures (e.g., FinFETs), leads to increasing parameter correlation. As a result, the parameters characterizing the target often cannot be reliably decoupled with available measurements. In another example, opaque, high-k materials are increasingly employed in modern semiconductor structures. Optical radiation is often unable to penetrate layers constructed of these materials. In addition, the wavelengths of visible light, e.g., ~500 nanometers, or UV light, e.g., ~200 nanometers, are much larger than many of the dimensions of interest of advanced semiconductor structures, e.g., ~5-50 nanometers. As a result, changes in reflectivity or scattering detected with visible or UV illumination due to small dimensional changes or small particles are very small, e.g., a few parts in 1000 or 10,000. As a result, measurements with thin-film scatterometry tools such as ellipsometers or reflectometers are becoming increasingly challenging.

In response, more complex optical tools have been developed. For example, tools with multiple angles of illumination, shorter and broader ranges of illumination wavelengths, and more complete information acquisition from reflected signals (e.g., measuring multiple Mueller matrix elements in addition to the more conventional reflectivity or ellipsometric signals) have been developed. However, these approaches have not reliably overcome fundamental challenges associated with measurement of many advanced targets (e.g., complex 3D structures, structures smaller than 10 nm, structures employing opaque materials) and measurement applications (e.g., line edge roughness and line width roughness measurements).

Atomic force microscopes (AFM) and scanning-tunneling microscopes (STM) are able to achieve atomic resolution, but they can only probe the surface of the specimen. In addition, AFM and STM microscopes require long scanning times. Scanning electron microscopes (SEM) achieve intermediate resolution levels, but are unable to penetrate structures to sufficient depth. Thus, high-aspect ratio holes are not characterized well. In addition, the required charging of the specimen has an adverse effect on imaging performance.

To overcome penetration depth issues, traditional imaging techniques such as TEM, SEM etc., are employed with destructive sample preparation techniques such as focused ion beam (FIB) machining, ion milling, blanket or selective etching, etc. For example, transmission electron microscopes (TEM) achieve high resolution levels and are able to probe arbitrary depths, but TEM requires destructive sectioning of the specimen. Several iterations of material removal and measurement generally provide the information required to measure the critical metrology parameters throughout a three dimensional structure. But, these techniques require sample destruction and lengthy process times. The complexity and time to complete these types of measurements introduces large inaccuracies due to drift of etching and metrology steps. In addition, these techniques require numerous iterations which introduce registration errors.

Another response to recent metrology challenges has been the adoption of x-ray metrology for measurements including film thickness, composition, strain, surface roughness, line edge roughness, and porosity. X-Ray based measurement systems, such as Small X-ray Scatterometry (SAXS) systems, X-Ray Reflectometry (XRR) systems, and X-Ray Fluorescence (XRF) systems, have shown promise to address challenging measurement applications.

X-rays having wavelengths of a few tenths of a nanometer, or shorter, penetrate a few microns, tens of microns, or even hundreds of microns into materials depending on the X-ray illumination wavelength and the materials under illumination. Thus, X-ray illumination offers significantly improved penetration compared to visible or UV illumination.

Unfortunately, contrast between most materials under X-ray illumination wavelengths is weak because the refractive indices of materials at X-ray illumination wavelengths are generally very close to one. As a result, the change in reflected, scattered, or transmitted X-rays caused by a significant change in structure shape or dimensions may be small even though X-ray wavelengths are generally smaller than the dimensions of most advanced semiconductor structures. Hence high radiance X-ray sources are needed to detect small changes in dimensions or small defects or particles.

Development efforts in the area of extreme ultraviolet (EUV) lithography are focused on light sources that emit narrowband radiation (e.g., +/−0.1 nm) centered at 13.5 nanometers (i.e., 92 electron volts) at high power levels (e.g., 210 watts of average power at the intermediate focus of the illuminator). Light sources for EUV lithography have been developed using a laser droplet plasma architecture. For example, xenon, tin, and lithium droplet targets operating at pulse repetition frequencies of approximately 100 kHz are pumped by CO2 coherent sources. The realized light is high power (e.g., 210 watts of average power at the intermediate focus of the illuminator is the goal for lithography tools at 13.5 nanometers). However, the resulting radiation is relatively low energy (92 electron volts), which severely limits the utility of these illumination sources in metrology applications. An exemplary system is described in U.S. Pat. No. 7,518,134 to ASML Netherlands B.V., the content of which is incorporated herein by reference in its entirety.

X-rays are most commonly generated by an electron beam focused onto a metal anode. To generate X-rays with high radiance, a high-power electron beam must be focused to small area on a metal anode target. The X-ray emission comprises a continuum of Bremsstrahlung radiation and discrete lines, i.e., emission lines that are a characteristic of the element(s) comprising the anode. Typically, only a small percentage of the electron beam power is converted to X-rays. The rest of the electron beam power is dissipated as heat in the anode. For common metrology and inspection applications, a relatively narrow bandwidth X-ray source is required. Thus, only a very small number of the characteristic emission lines are employed to illuminate the specimen under measurement. As a result, only a very small percentage of electron beam power is converted to useful X-Ray illumination, e.g., less than 1%.

X-rays must be emitted from a small area of the anode to achieve high radiance. A key factor limiting the maximum radiance of a metal anode X-ray source is the power density, i.e., power per unit area, of the electron beam incident on the anode. For typical applications in semiconductor metrology and inspection, the X-ray emission area must have dimensions of a few microns or a few tens of microns to achieve sufficient radiance. Since less than 1% of the electron beam power is converted to X-rays having the desired characteristic wavelength, an electron beam power of hundreds of Watts, or more, is desirable. However, when focused into an area having dimensions of a few microns or a few tens of microns, the resulting power density can easily sputter material from the anode, melt the anode material, or both, particularly if the electrons have a high landing energy.

Almost all commercially available X-ray sources use thermionic emission from a hot tungsten source as the electron source. The power of an electron beam is equal to the product of its current and accelerating voltage (i.e., the voltage difference between the electron source and anode). However, operating a tungsten cathode with a continuous emission current of hundreds of milliamps, or higher, results in a short lifetime. Thus, in a high power application, a tungsten cathode typically operates at a relatively small current and high accelerating voltage, e.g., 100 kiloelectron-volts or higher, to achieve a long operating lifetime. This results in strong Bremsstrahlung radiation over a wide range of X-ray energies including energy close to the energy of the electrons in the electron beam. Although a few applications may benefit from having a wide range of X-ray wavelengths, most metrology and inspection applications in the semiconductors fabrication process require a narrow range of x-ray illumination wavelengths, e.g., a wavelength range less than 1 picometer or a wavelength range less than 0.1 picometers). Thus, most of the X-rays generated by electron bombardment of an anode by electrons generated from thermionic emission from a hot tungsten source must be discarded. As a result, the radiance of useable illumination X-rays emitted from an anode as a result of bombardment by electrons at relatively high landing energy is relatively low.

Future metrology applications present challenges for metrology due to increasingly high resolution requirements, multi-parameter correlation, increasingly complex geometric structures, and increasing use of opaque materials. The adoption of x-ray metrology for semiconductor applications requires improved x-ray sources with the highest possible radiance.

SUMMARY

Methods and systems for realizing a high radiance x-ray source based on a high density electron emitter array are presented herein. The high radiance x-ray source is suitable for high throughput x-ray metrology and inspection in a semiconductor fabrication environment. The high radiance x-ray source enables measurement of structural and material characteristics (e.g., material composition, dimensional characteristics of structures and films, defects, etc.) associated with different semiconductor fabrication processes.

In one aspect, a high radiance X-ray source includes an array of electron emitters that generate a large electron current focused over a small anode area to generate high radiance X-ray illumination light. In some embodiments, electron current density across the surface of the electron emitter array is at least 0.01 Amperes/mm$^2$. Furthermore, the electron current is focused onto an area of the anode characterized by a dimension of maximum extent of less than 100 micrometers.

In some embodiments, an array of electron emitters is fabricated on a silicon substrate. In some embodiments, an electron emitter array is fabricated with spacing between emitters of less than 5 micrometers. In some embodiments, an electron emitter array includes more than 10,000 electron emitters. In some embodiments, an electron emitter array includes more than 100,000 electron emitters. In some embodiments, an electron emitter array includes more than 1,000,000 electron emitters.

In a further aspect, an electron emitter array includes multiple extractor voltage channels to control uniformity of electron current output.

In another further aspect, each electron emitter of an electron emitter array includes a focusing electrode layer spaced apart from the tip of each emitter to shape the flow of electron current extracted from each emitter.

In another further aspect, an electron emitter array includes an optical light source that illuminates the electron emitter array to enhance electron emission.

An X-ray source includes an electron emitter array that generates a high current electron beam incident on and anode. In response to the incident electron beam, the anode emits high radiance x-ray illumination. The high current electron beam is the aggregation of the electron beams generated by each electron emitter of electron emitter array.

In another aspect, the electrons emitted by the array of electron emitters are accelerated from the electron emitter array to the anode to a landing energy at the anode that is less than four times the energy of a desired X-ray emission line.

In yet another aspect, the electrons emitted by an electron emitter array are focused at the anode to an area having a dimension of maximum extent of less than 60 micrometers. In some embodiments, the electrons emitted by an electron emitter array are focused at the anode to an area having a dimension of maximum extent of less than 20 micrometers.

In another further aspect, the temperature of the electron emitter array is actively controlled to maintain a stable electron emission by desorbing any ions that adhere to a surface of an emitter. In some embodiments, the temperature of an electron emitter array is actively controlled within a temperature range between 400 and 1,000 degrees Centigrade to maintain stable emission.

Elements of an X-ray source including the electron emitter array, the electron beam, and the anode are maintained in a vacuum environment within a vacuum chamber. In some embodiments, vacuum chamber 120 is sealed and evacuated during manufacturing. In another further aspect, the vacuum at the electron emitter array is maintained at a lower pressure than the vacuum at the anode. In some embodiments, the vacuum environment at the electron emitter array is maintained at a pressure of $10^{-9}$ Torr, or lower. To achieve this pressure differential, one or more barriers are fabricated between the electron emitter array and the anode. In some embodiments, each barrier includes a small aperture through which the electron beam passes. In some other embodiments, a thin metal foil is located across each aperture to stop gas flow. The thin metal foil does not significantly impede the current flow of electron beam, but effectively stops gas flow through each barrier.

In another further aspect, the anode is configured to transmit heat away from the anode material to minimize the risk of damage to the anode material itself. In general, x-ray illumination light is generated by high energy electron beam bombardment of a solid target material or liquid target material. In some embodiments, the anode includes anode material at the surface subject to bombardment by the electron beam and additional materials or structures in contact with the anode material to improve thermal conductivity, assist with heat transfer from the anode, or both.

In a further aspect, a high radiance X-ray source based on an electron emitter array is employed as an X-Ray source for a semiconductor metrology or inspection system. The high energy nature of x-ray radiation allows for the penetration of x-rays into optically opaque thin films, buried structures, high-aspect ratio structures and devices containing many thin film layers. Many x-ray metrology techniques used in semiconductor manufacturing benefit from a high radiance, reliable x-ray source, e.g., critical dimension small angle x-ray scattering (CD-SAXS).

The foregoing is a summary and thus contains, by necessity, simplifications, generalizations and omissions of detail; consequently, those skilled in the art will appreciate that the summary is illustrative only and is not limiting in any way. Other aspects, inventive features, and advantages of the devices and/or processes described herein will become apparent in the non-limiting detailed description set forth herein.

DETAILED DESCRIPTION

Reference will now be made in detail to background examples and some embodiments of the invention, examples of which are illustrated in the accompanying drawings.

Methods and systems for realizing a high radiance x-ray source suitable for high throughput x-ray metrology and inspection based on a high density electron emitter array are presented herein. The high radiance x-ray source enables measurement of structural and material characteristics (e.g., material composition, dimensional characteristics of structures and films, defects, etc.) associated with different semiconductor fabrication processes.

In one aspect, a high radiance X-ray source includes an array of electron emitters that generate a large electron current focused over a small anode area to generate high radiance X-ray illumination light. In some embodiments, electron current density across the surface of the electron emitter array is at least 0.01 Amperes/mm$^2$. Furthermore, the electron current is focused onto an area of the anode characterized by a dimension of maximum extent of less than 100 micrometers.

Figure 1:
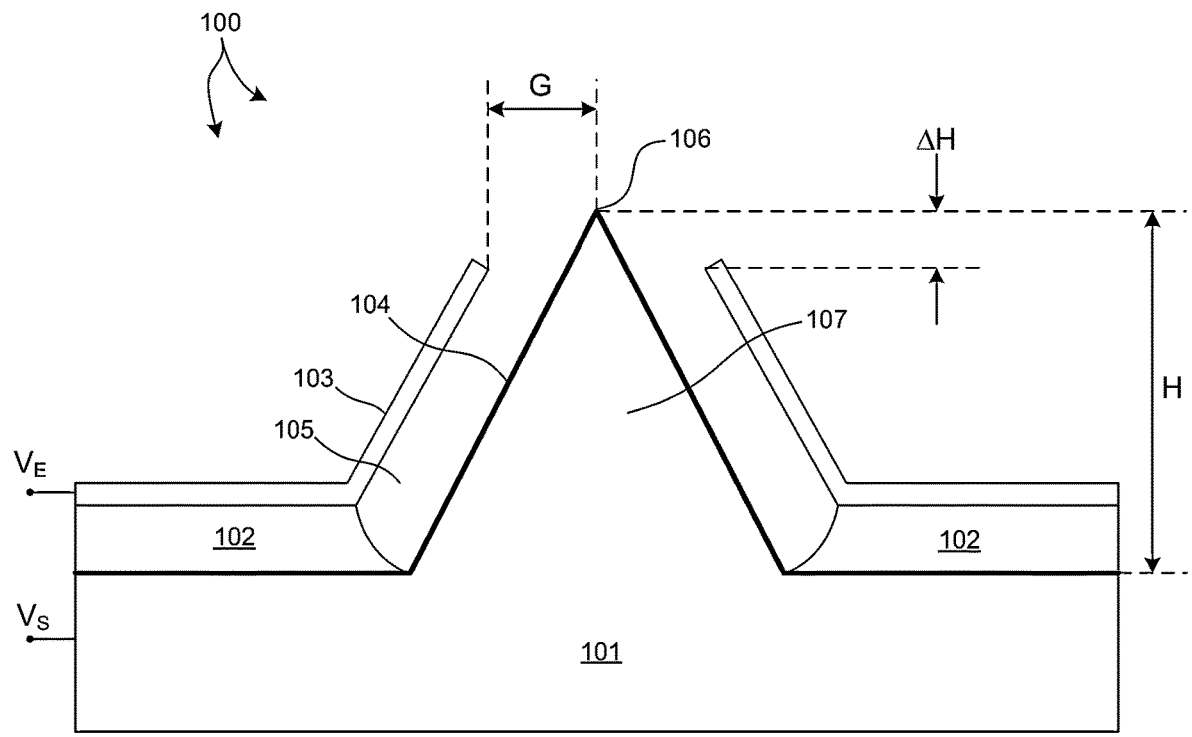
FIG. 1 is a diagram illustrative of a cross-sectional view of an electron emitter in one embodiment.

FIG. 1 is a diagram illustrative of a cross-sectional view of an electron emitter in one embodiment. FIG. 1 depicts one electron emitter 100 of an array of electron emitters fabricated on a silicon substrate 101 comprising n-type or p-type doped silicon. The top surface of the silicon substrate 101 is etched to create an array of protrusions, such as protrusion 107. Each protrusion extends vertically from the silicon substrate 101 and terminates at a sharp tip 106 having a very small tip radius. In the embodiment depicted in FIG. 1, the height of the protrusion 107, H, is 1-2 micrometers and the tip radius is 20 nanometers, or less. As depicted in FIG. 1, protrusion 107 is a cone shaped protrusion having sharp tip 106. However, in general, any suitable shape that terminates with a sharp tip, e.g., a pyramid shape, may be contemplated within the scope of this patent document.

Each protrusion, e.g., protrusion 107, is coated with a protective layer 104 to prevent oxidation of the protrusion surface. Protective layer 104 may be fabricated from a number of different materials. By way of non-limiting example, suitable protective layer materials include boron, a boride material, e.g., lanthanum hexaboride ($LaB_6$), a carbide material, e.g., silicon carbide or hafnium carbide, and a semi-metal material, e.g., titanium nitride, tantalum nitride or a metal silicide.

A dielectric layer 102 is deposited over the surface of the silicon substrate 101 surrounding the emitter protrusions. By way of non-limiting example, suitable dielectric materials include silicon dioxide, silicon nitride, etc. In some embodiments, the thickness of the dielectric layer 102 is between 250 and 500 nanometers. However, in general, any suitable thickness may be contemplated within the scope of this patent document.

An extraction electrode layer 103 is deposited over the dielectric layer 102. Extraction electrode layer 103 includes an electrically conductive material such as a doped polycrystalline silicon or a metal. By way of non-limiting example, suitable extraction electrode materials include aluminum, titanium, tungsten, niobium, tantalum, and molybdenum. Extraction electrode layer 103 is etched to produce a void 105 between the tip 106 of silicon protrusion 107 and extraction electrode layer 103. The void leaves a gap, G, between tip 106 and extraction electrode layer 103. In some embodiments, the gap, G, is smaller than one micrometer. In some embodiments, gap, G, is between 200 nanometers and 500 nanometers. In some embodiments, the tip 106 of protrusion 107 extends above extraction electrode 103 by a distance, $\Delta H$. In the embodiment depicted in FIG. 1, $\Delta H$ is approximately 50-100 nanometers. However, in general, $\Delta H$, may be larger or smaller. In some embodiments, the tip 106 of protrusion 107 is located below extraction electrode 103.

As depicted in FIG. 1, extraction electrode layer 103 is maintained at a voltage, $V_E$, and silicon substrate 101 is maintained at a voltage, $V_S$. To generate electron emission, $V_E$ is maintained at a higher potential (i.e., more positive) than $V_S$ by a few tens of volts, e.g., 30-100V. The potential difference creates a strong electric field near the tip of each emitter and causes electron emission.

Figure 2:
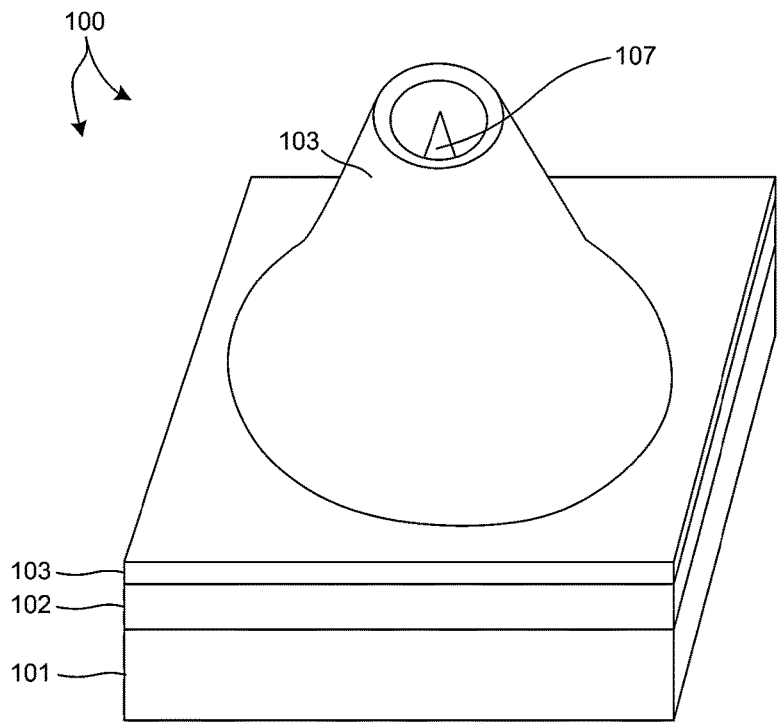
FIG. 2 is a diagram illustrative of a perspective view of the electron emitter depicted in FIG. 1.

FIG. 2 is a diagram illustrative of a perspective view of the electron emitter 100 depicted in FIG. 1.

Figure 3:
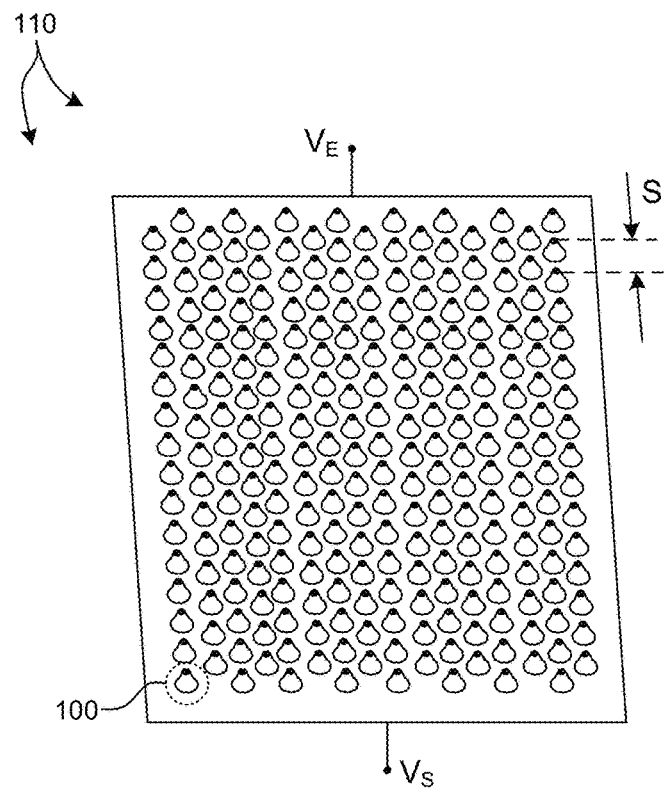
FIG. 3 is a diagram illustrative of a perspective view of an array of electron emitters, such as the electron emitter depicted in FIGS. 1 and 2, fabricated on a silicon substrate.

FIG. 3 is a diagram illustrative of a perspective view of an array of electron emitters 110, such as electron emitter 100 depicted in FIGS. 1 and 2, fabricated on a silicon substrate. In some embodiments, an electron emitter array is a one dimensional array, i.e., an array extending in one direction. In some embodiments, an electron emitter array is a two dimensional array, such as electron emitter array 110 depicted in FIG. 3. The electron emitter arrays described herein are fabricated with high spatial density. In some embodiments, an electron emitter array is fabricated with a spacing, S, between emitters of less than 5 micrometers. In some embodiments, an electron emitter array is fabricated with a spacing, S, between emitters of less than 3 micrometers. In some embodiments, an electron emitter array includes more than 100 electron emitters. In some embodiments, an electron emitter array includes more than 10,000 electron emitters. In some embodiments, an electron emitter array includes more than 100,000 electron emitters. In some embodiments, an electron emitter array includes more than 1,000,000 electron emitters.

In some embodiments, each electron emitter generates an electron current of approximately 1 microampere. Thus, the electron emitter arrays described herein are capable of generating large electron currents over a relatively small area. For example, a 333×333 electron emitter array having electron emitters spaced apart by a distance of 3 micrometers generates an electron beam current of approximately 110 milliamps over an area of 1 mm² (e.g., 1 mm×1 mm). Similarly, a 1,000×1,000 electron emitter array having emitters spaced apart by a distance of 5 micrometers generates an electron beam current of 1 Ampere over an area of 25 mm² (e.g., 5 mm×5 mm).

Thus, in some embodiments, the current density of an electron beam at the emitter surface generated by an electron emitter array as described herein is at least 0.01 Ampere/mm². In some embodiments, the current density of an electron beam at the emitter surface generated by an electron emitter array as described herein is at least 0.05 Ampere/mm². In some embodiments, the current density of an electron beam at the emitter surface generated by an electron emitter array as described herein is at least 0.1 Ampere/mm².

In a further aspect, an electron emitter array includes multiple extractor voltage channels to control uniformity of electron current output.

Figure 4:
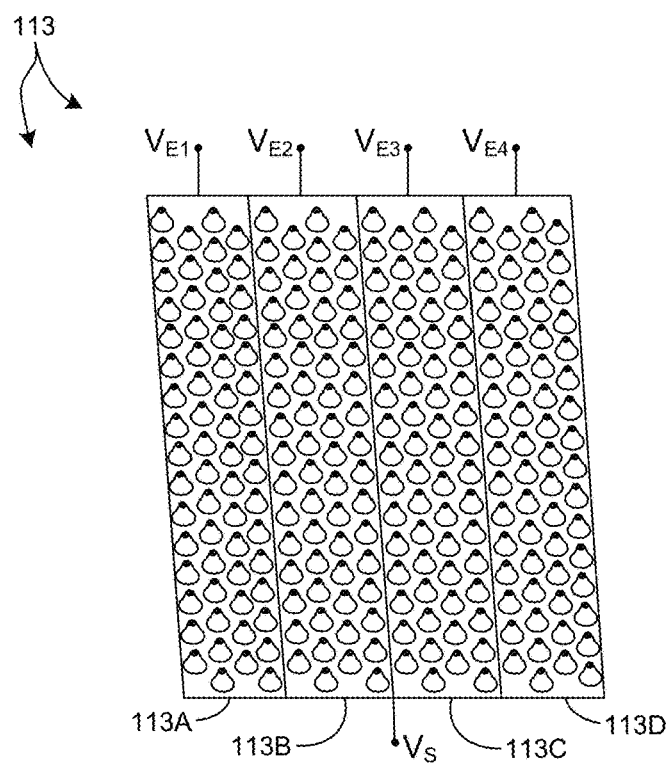
FIG. 4 is a diagram illustrative of an electron emitter array having multiple extractor voltage channels.

FIG. 4 is a diagram illustrative of an electron emitter array 113 having multiple extractor voltage channels. As depicted in FIG. 4, the substrate of electron emitter array is addressable by a single substrate voltage, V. More specifically, tips of each emitter of the electron emitter array 113 are maintained at the same voltage, V. However, the extraction electrode layer of electron emitter array 113 is electrically subdivided into four electrically isolated regions 113A-D. Thus, a different voltage may be maintained at each separate channel. As depicted in FIG. 4, a voltage $V_{E1}$ is maintained on extractor voltage channel 113A, a voltage $V_{E2}$ is maintained on extractor voltage channel 113B, a voltage $V_{E3}$ is maintained on extractor voltage channel 113C, and a voltage $V_{E4}$ is maintained on extractor voltage channel 113D.

In some embodiments, the voltages maintained on each extractor voltage channel are selected to optimize uniformity of electron current flow over the entire area of the electron emitter array. In one example, electron current flow from each region may be measured individually, and the extraction voltage associated with each region is adjusted to achieve a desired set point. In this manner, the voltage of each extraction voltage channel may be controlled, e.g., by computing system 130, to achieve a desired electron beam uniformity.

In general, an electron emitter array may be subdivided into any number of extractor voltage channels. In some embodiments, extractor electrode layer of each electron emitter may be individually addressable. In these embodiments, the number of extractor voltage channels is the same as the number of electron emitters of the electron emitter array. In other embodiments, any suitable number of electron emitters may be grouped together as an independently addressable extractor voltage channel.

Figure 5:
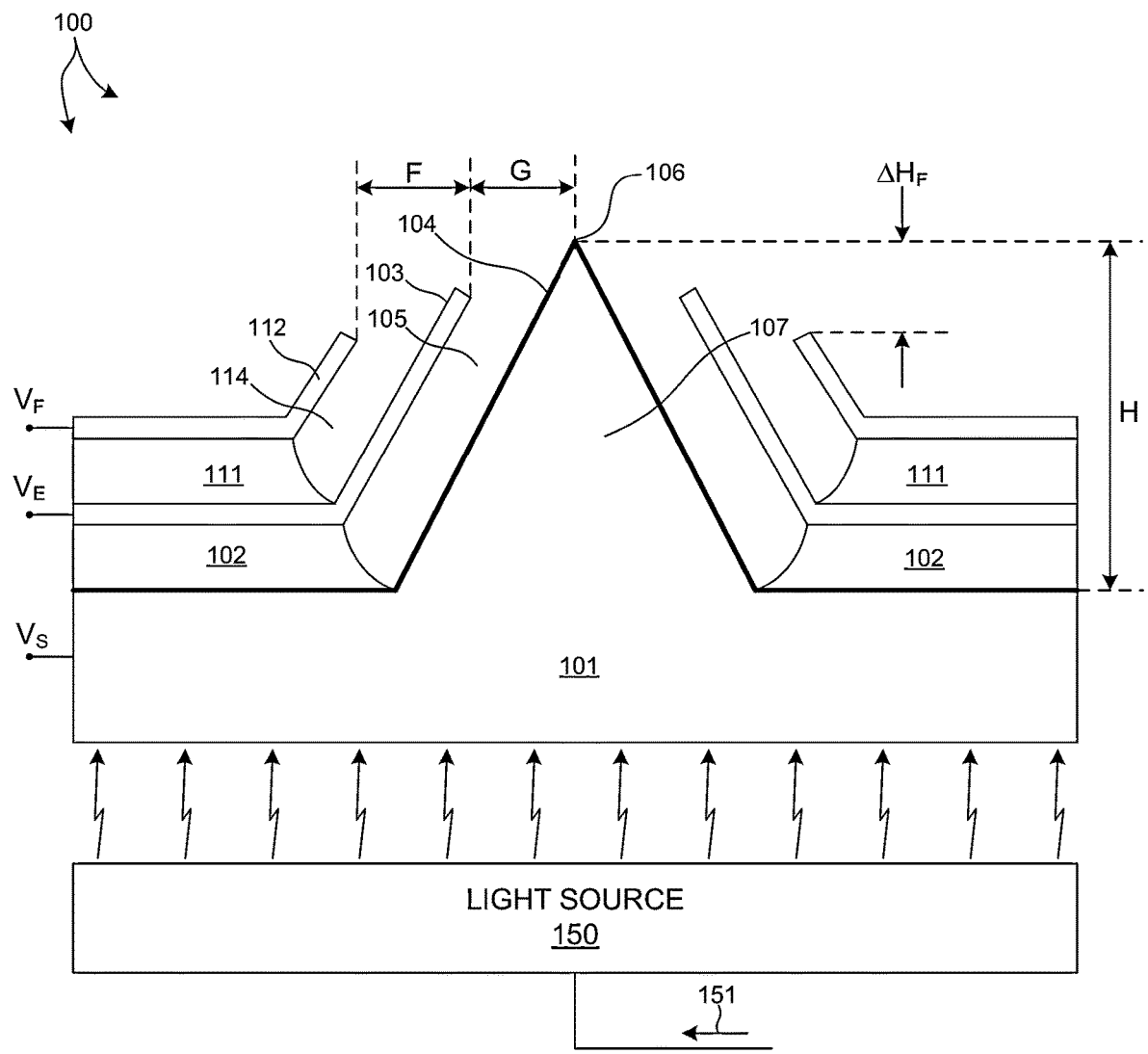
FIG. 5 depicts a diagram illustrative of an electron emitter including a focusing electrode.

In another further aspect, each electron emitter of an electron emitter array includes a focusing electrode layer spaced apart from the tip of each emitter to shape the flow of electron current extracted from each emitter. FIG. 5 depicts a diagram illustrative of electron emitter 100 including a focusing electrode 112. As depicted in FIG. 5, a second dielectric layer 111 is deposited above extraction electrode layer 103. By way of non-limiting example, suitable dielectric materials include silicon dioxide, silicon nitride, etc. In some embodiments, the thickness of the dielectric layer 111 is between 250 and 500 nanometers. However, in general, any suitable thickness may be contemplated within the scope of this patent document.

Focusing electrode layer 112 is deposited over the dielectric layer 111. Focusing electrode layer 112 includes an electrically conductive material such as a doped polycrystalline silicon or a metal. By way of non-limiting example, suitable focusing electrode materials include aluminum, titanium, tungsten, niobium, tantalum, and molybdenum. Focusing electrode layer 112 is etched to produce a void 114 between focusing electrode layer 112 and extraction electrode layer 103. The void leaves a gap, F, between focusing electrode layer 112 and extraction electrode layer 103. In some embodiments, the gap, F, is greater than one micrometer. In some embodiments, gap, F, is between 200 nanometers and one micrometer. In some embodiments, the tip 106 of protrusion 107 extends above focusing electrode 112 by a distance, $\Delta H_F$. In the embodiment depicted in FIG. 5, $\Delta H_F$ is approximately 500 nanometers. However, in general, $\Delta H_F$, may be larger or smaller. In some embodiments, the tip 106 of protrusion 107 is located below focusing electrode 112.

Focusing electrode 112 is biased at a negative or positive potential relative to silicon substrate 101. The electrical potential present on focusing electrode layer 112, along with the electrical potential present on extraction electrode layer 103 relative to silicon substrate 101, focuses the electron emission from emitter tip 106. In this manner, the emission from each electron emitter of an electron emitter array is directed towards an anode of an x-ray source. In some embodiments, the voltage, $V_F$, of focusing electrode layer 112 is dynamically adjusted relative to the voltage of silicon substrate 101 to achieve a desired change in the shape of the electron beam emitted from the electron emitter array, e.g., beam divergence. In this manner, the voltage of focusing electrode layer 112 may be controlled, e.g., by computing system 130, to achieve a desired electron beam shape. In addition, the focusing electrode layer 112 may be subdivided into a number of focusing channels in a manner as described hereinbefore with reference to the extraction electrode layer. By independently controlling each focusing channel, the focusing of emitted electrons provided by the focusing electrode layer may be adjusted differently, e.g., by computing system 130, depending on location on the electron emitter array.

In a further aspect, an electron emitter array includes an optical light source that illuminates the electron emitter array to enhance electron emission. FIG. 5 depicts a light source 150 that illuminates the backside of silicon substrate 101. The optical illumination transmits through silicon substrate 101 and stimulates photoelectron emission from each emitter tip. The optical illumination increases the number of free carriers, i.e., electrons in the silicon substrate to increase electron emission. As depicted in FIG. 5, a control signal 151 is communicated to light source 150 to control the optical illumination generated by light source 150. In some embodiments, computing system 130 generates control signal 151 to control light source 150, and thus the electron current flow generated by the electron emitter array due to optical illumination by light source 150. Further details are described in U.S. patent application Ser. No. 17/020,277, filed Sep. 14, 2020 and assigned to KLA Corporation, the content of which is incorporated herein by reference in its entirety.

Figure 6:
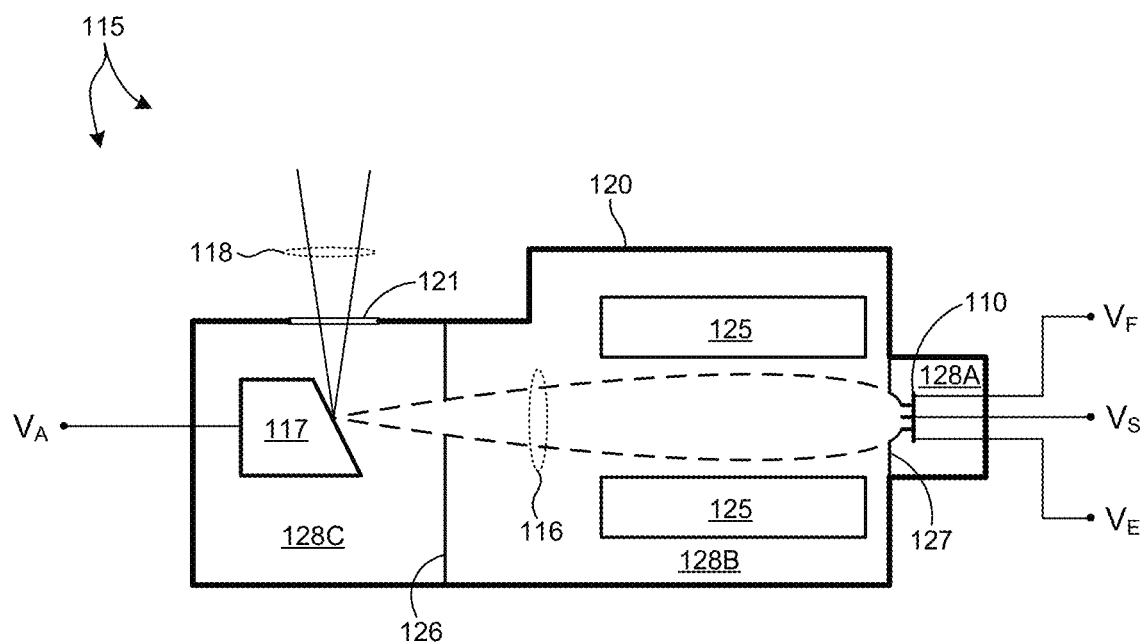
FIG. 6 depicts a diagram illustrative of an X-ray illumination source based on an electron emitter array.

FIG. 6 depicts a diagram illustrative of an X-ray illumination source 115 based on an electron emitter array, such as electron emitter array 110 as described herein. X-ray source 115 includes an electron emitter array 110 that generates a high current electron beam 116 incident on anode 117. In response to the incident electron beam 116, anode 117 emits high radiance x-ray illumination 118. High current electron beam 116 is the aggregation of the electron beams generated by each electron emitter of electron emitter array 110. As described hereinbefore, the electron current of beam 116 may exceed 100 milliamps, 500 milliamps, or 1 ampere.

In another aspect, the electrons emitted by the array of electron emitters are accelerated from the electron emitter array to the anode to a landing energy at the anode that is less than four times the energy of a desired X-ray emission line.

X-ray sources employed in semiconductor metrology and inspection applications generally utilize narrowband X-ray illumination to characterize the specimen under measurement. Typically, X-rays are generated at a particular characteristic emission line and wavelengths that do not correspond to the emission line are filtered out before illuminating the specimen.

For most elements, conversion of electron beam power into characteristic X-ray line emission occurs most efficiently when the incident electron energy is about 2.5 to 3 times the energy of the characteristic X-ray line. Although, applying higher accelerating voltage to the electron beam will increase X-ray power, higher energy electrons generally increase the fraction of power converted to undesired Bremsstrahlung (broadband) emission compared to the power converted to desired characteristic X-ray line emission. Although the power of the characteristic X-ray line emission may increase with increased accelerating voltage, the increase in emission at this wavelength diminishes for high accelerating voltages. In addition, high accelerating voltages introduce reliability and lifetime limitations on the electron emitter.

Furthermore, high energy electrons generate high energy X-rays, e.g., X-rays having energies close to the maximum electron energy, that are difficult to block. In these embodiments, thick metal enclosures and beam blocks fabricated from thick metal materials (e.g., thickness of many millimeters) are required to block the undesired high energy X-rays. Such design measures make the X-ray based instrument undesirably costly and heavy. By limiting the electron beam energy to four times or less the energy corresponding a desired X-ray wavelength, the generated X-ray energies will also be limited.

As described herein, a high-current electron beam is employed to generate high radiance X-ray illumination using electrons accelerated from the electron emitter array to the anode to a landing energy at the anode that is less than four times the energy of a desired X-ray emission line. In a preferred embodiment, high radiance X-ray illumination is generated using electrons accelerated from the electron emitter array to the anode to a landing energy at the anode that is approximately three times the energy of a desired X-ray emission line. In this manner, an X-ray illumination source employing a high current electron beam with relatively low landing energy provides high radiance X-ray illumination, both efficiently and reliably.

In the embodiment depicted in FIG. 6, anode 117 is maintained at an anode voltage, $V_A$. The difference between the anode voltage, $V_A$, and the substrate voltage, $V_S$, determines the landing energy of the electron beam at anode 117. In one embodiment, the desired X-ray wavelength corresponds to the K-emission line of copper having an energy of approximately 8 kiloelectronvolts. In this embodiment, the energy of the electrons of electron beam 116 incident at anode 117 is preferably between 16 kiloelectronvolts and 32 kiloelectronvolts (i.e., between two times and four times the energy of the K-emission line of copper). Thus, in this example, the difference between the anode voltage, $V_A$, and the substrate voltage, $V_S$, is between 16 kiloelectronvolts and 32 kiloelectronvolts.

In another aspect, the electrons emitted by an electron emitter array are focused at the anode to an area having a dimension of maximum extent of less than 60 micrometers. In some embodiments, the electrons emitted by an electron emitter array are focused at the anode to an area having a dimension of maximum extent of less than 20 micrometers.

Metrology and inspection systems employed to measured or inspect features of semiconductor wafers typically measure or inspect areas with dimensions between 10 and 30 micrometers. In some embodiments, no magnification or de-magnification of the X-ray image is employed. In these embodiments, it is preferable that the X-ray emission area at the anode approximately match the dimensions of the measurement or inspection area. In some other embodiments, de-magnification of the X-ray image by a factor of 2 is employed. In these embodiments, it is preferable that the X-ray emission area at the anode is approximately 2 times the dimensions of the measurement or inspection area.

As depicted in FIG. 6, electron lens 125 focuses electron beam 116 on anode 117. In some embodiments, electron lens 125 is a single cylindrically symmetric electrode. However, in general, many other focusing configurations are contemplated within the scope of this patent document, including multiple electron optical elements.

Electron optics 125 are configured to direct and/or focus the stream of electrons 116 toward anode 117. Electron optics 125 includes suitable electromagnets, permanent magnets, or any combination of electromagnets and permanent magnets for focusing the electron beam and directing the stream of electrons 116. In some embodiments, electron optics 125 may include solenoids, quadrupole lenses such as Halbach cylinders or electrostatic elements such as Einzel lenses to focus and direct the electron beam. In addition, electron optics 125 may be configured as an electron monochromator. Moreover, electron optics 125 may be employed to focus the beam to further reduce electron beam noise.

As described hereinbefore, an electron emitter array may be fabricated with an emitter spacing of approximately 3-5 micrometers. Hence an array of 300×300 emitters might occupy a square area with sides approximately 1 mm to 1.5 mm long. For such array dimensions, electron lens 125 is configured to have a demagnification greater than about 16× to focus electron beam 116 to an area at anode 117 with dimensions of about 60 µm or less.

In some embodiments, the temperature of electron emitter array 110 is determined by the balance of heat dissipated from the array and the heat generated by the current flowing through the emitters during operation.

In a further aspect, the temperature of the electron emitter array is actively controlled to maintain a stable electron emission by desorbing any ions that adhere to a surface of an emitter. In some embodiments, the temperature of an electron emitter array is actively controlled within a temperature range between 400 and 1,000 degrees Centigrade to maintain stable emission. In some embodiments, a flow of cooling fluid or a radiative cooler is controlled by computing system 130 to actively control the temperature of an electron emitter array.

As depicted in FIG. 6, elements of X-ray source 115 including the electron emitter array, the electron beam, and the anode are maintained in a vacuum environment within a vacuum chamber 120. In some embodiments, vacuum chamber 120 is sealed and evacuated during manufacturing. In a preferred embodiment the vacuum environment within the vacuum chamber is maintained at one or more desired vacuum levels during operation by one or more vacuum pumps (not shown). Window 121 transmits X-rays 118 emitted by anode 117 at the exit of X-ray source 115. In a preferred embodiment, window 121 is fabricated from a low atomic number material, such as beryllium.

In a further aspect, the vacuum at electron emitter array 110 is maintained at a lower pressure than the vacuum at the anode. In some embodiments, the vacuum environment 128A at the electron emitter array 110 is maintained at a pressure of $10^{-9}$ Torr, or lower, e.g., $10^{-10}$ Torr. As depicted in FIG. 6, vacuum environment 128A is maintained at a lower pressure than vacuum environment 128C at anode 117. To achieve this pressure differential, one or more barriers are fabricated between electron emitter array 110 and anode 117. As depicted in FIG. 6, barriers 126 and 127 separate vacuum environment 128A from vacuum environment 128C. In some embodiments, barriers 126 and 127 each include a small aperture through which electron beam 116 passes. Lower pressure is maintained in vacuum environment 128A by active pumping of vacuum environment 128A. Due to the small size of the apertures, the gas flow through the aperture is minimized. In some other embodiments, a thin metal foil is located across each aperture to stop gas flow. The thin metal foil does not significantly impede the current flow of electron beam 116, but effectively stops gas flow through each barrier. In one embodiment, the metal foil includes any of beryllium, magnesium, and aluminum. These metals have low atomic numbers and scatter electrons less than higher atomic number metals. Each metal foil should be as thin as possible with sufficient mechanical strength. In some embodiments, the thickness of the metal foil is less than 20 micrometers thick, e.g., a thickness of about 10 micrometers, 5 micrometers, or thinner.

In the embodiment depicted in FIG. 6, the vacuum chamber 120 is subdivided into three different vacuum environments 128A-C. Vacuum environment 128A is maintained at a lower pressure than vacuum environment 128B, which, in turn, is maintained at a lower pressure than vacuum environment 128C.

Anode 117 includes a metal selected to emit a desired characteristic X-ray wavelength. In one embodiment, anode 117 includes copper, which emits X-rays having a characteristic energy of approximately 8 kiloelectronvolts. In another embodiment, anode 117 includes molybdenum, which emits X-rays having a characteristic energy of approximately 18 kiloelectronvolts. Other anode materials may be employed to generate other wavelengths, such as tungsten.

Anode structures absorb substantial amounts of heat converting electron energy to X-ray energy. In some embodiments, an anode material having high thermal conductivity is selected to facilitate cooling of the anode during operation. In one example, copper anode material is selected because copper has high thermal conductivity. However, the characteristic X-ray lines of copper at 8 kiloelectronvolts are not sufficiently energetic to penetrate hundreds of microns of silicon or similar materials required in some semiconductor measurement and inspection applications. In addition, copper has a relatively low melting temperature. Other anode materials such as Molybdenum and Tungsten have significantly higher melting temperatures and higher energy characteristic X-ray emission lines, but they do not conduct heat as well as copper. Some refractory metals also have higher energy X-rays lines and high melting points, and thus are suitable X-ray anode materials. However, the low thermal conductivity of these materials may limit the achievable X-ray radiance.

In a further aspect, anode 117 is configured to transmit heat away from the anode material to minimize the risk of damage to the anode material itself. In general, x-ray illumination light is generated by high energy electron beam bombardment of a solid target material or liquid target material. In some embodiments, anode 117 includes anode material at the surface subject to bombardment by electron beam 116 and additional materials or structures in contact with the anode material to improve thermal conductivity, assist with heat transfer from the anode, or both.

In some embodiments, anode 117 is a stationary structure including solid anode material, and electron beam 116 is incident at the same location on anode 117 during operation.

In some embodiments, anode 117 includes a rotating structure including solid anode material. The electron beam 116 is incident at different locations on the surface of anode 117 over time. In this manner, the time-averaged power density incident at any region of anode material is much lower than instantaneous power density where the electron beam is incident. The ratio of the time-averaged power density to the instantaneous power density subject to bombardment by the electron beam depends on the ratio of the dimensions of the area where the electron beam is incident to the circumference of the anode. Weight, cost, and other practical consideration limit the size of the rotating anode structure.

Rotating solid anode X-ray sources are commonly employed in medical imaging and analytical chemistry applications. Numerous versions of rotating solid anode X-ray sources are manufactured by companies such as Koninklijke Philips N.V. (The Netherlands), General Electric Company (United States), Siemens AG (Germany), and others, for medical imaging applications such as tomography, mammography, angiography, etc. Rigaku Corporation and Bruker Corporation manufacture continuously operated rotating anode sources for analytical chemistry applications such as X-Ray diffraction (XRD), X-Ray Reflectometry (XRR), small angle X-Ray scatterometry (SAXS), wide angle X-Ray scatterometry (WAXS), etc.

Rotating anode targets enable more effective heat removal from the anode material compared to stationary anode targets. Continuously moving the location of electron beam impingement on the anode surface results in convective heat dissipation that decreases focal spot impact temperature and improves X-ray tube power loading capability. A typical rotating anode source rotates anode material at 5,000-10,000 revolutions per minute, or higher. The linear speed of the anode material at the focal spot location may be 100 meters/second, or higher.

Improvements directed toward increased anode heat dissipation and thermal conductivity have been proposed. For example, the FR-X model X-ray sources manufactured by Rigaku Corporation (Japan) and the MicroMax model X-ray sources manufactured by Bruker AXS GmbH (Germany) employ water cooling to dissipate heat generated at the anode.

U.S. Pat. No. 9,715,989 describes a rotating anode structure with high thermal conductivity diamond layers. U.S. Pat. No. 8,243,884 describes the use of diamond-metal composite materials to improve heat dissipation. U.S. Pat. No. 7,440,549 describes a rotating anode device that dissipates heat by a heat pipe effect. U.S. Patent Publication No. 2015/0092924 describes a microstructural anode including a high atomic number material embedded in a high thermal conductivity matrix. U.S. Pat. Nos. 9,159,524 and 9,715,989 describe similar diamond-based heat management solutions in the context of stationary anode sources. The contents of the aforementioned U.S. Patents and U.S. Patent Publications are incorporated herein by reference in their entirety.

Despite improved power loading capabilities, rotating anode sources suffer from significant limitations. In practice, micro-cracks form at the surface of the solid anode material located on the focal track (i.e., the locus of points repeatedly subjected to e-beam impingement) due to repeated thermal cycling. These micro-cracks introduce losses due to increased absorption. In some examples, a 20-30% drop in X-ray flux occurs within the first 1,000 hours of source operation. In addition, in some examples, a typical rotating anode requires re-polishing (i.e., restoration of the surface of the anode material) approximately every 3,000 hours. In addition, in some examples, high rotation speeds limit the achievable X-ray spot size and spatial stability of the X-ray spot.

In some embodiments, anode 117 includes a liquid metal within a conventional solid anode structure to more efficiently conduct heat away from the location of incidence of the electron beam. U.S. Pat. No. 4,146,815 issued to Childeric on Mar. 27, 1979, describes such a structure, the content of which is incorporated herein by reference in its entirety.

Although removing heat more efficiently from a solid anode material enables an increase electron beam power, it does not stop ablation of material from the solid surface of the anode. The ablation of the solid anode surface ultimately limits the stability and lifetime of the source, particularly when configured to emit X-rays from a small area.

In some embodiments, anode 117 includes a liquid metal anode in the form of a flowing stream, jet, or sheet. Since the liquid metal anode is constantly replenished due to flow, ablation of material from the surface does not change the shape of the surface and effectively mitigates the formation of micro-cracks associated with solid anode targets.

U.S. Pat. No. 6,185,277 issued to Harding on Feb. 6, 2001, and Hemberg et al., "Liquid-metal-jet anode electron-impact x-ray source," Applied Physics Letters, Aug. 18, 2003, vol. 83, No. 7, pp. 1483-1485, describe liquid metal anode structures, and are incorporated herein by reference in their entirety. An exemplary liquid metal jet x-ray illumination system is described in U.S. Pat. No. 7,929,667 to Zhuang and Fielden, the content of which is incorporated herein by reference in its entirety. Another exemplary liquid metal jet x-ray illumination source is described in U.S. Pat. No. 6,711,233, the content of which is incorporated herein by reference in its entirety.

Mercury and Gallium are metals most suitable for use when jetting liquid metal anode materials because of their low melting points. However, the characteristic X-rays of Mercury and Gallium do not lie within the range of desired X-ray wavelengths for many semiconductor metrology and inspection applications, such as applications requiring high radiance X-ray emission with photon energies between about 15 and 30 kiloelectronvolts. As a result a liquid metal anode material with a melting temperature higher than room temperature must be employed to generate X-rays at these energy levels.

In some embodiments, anode 117 includes a liquid metal anode flowed over a stationary structure. U.S. Pat. No. 4,953,191 describes a liquid metal anode material flowing over a stationary metal surface, the content of which is incorporated herein by reference in its entirety. U.S. Pat. No. 8,629,606 describes a liquid metal anode material flowing on internal surfaces of an X-ray source vacuum enclosure, the content of which is incorporated herein by reference in its entirety. U.S. Patent Publication No. 2014/0369476 and U.S. Pat. No. 8,565,381 describe a liquid metal anode material flowing through a channel or tube, the content of each is incorporated herein by reference in its entirety. The fast moving liquid metal is enclosed in part by suitable windows to allow electron beam penetration and X-ray extraction.

In some embodiments, anode 117 includes a rotating anode support structure that supports the liquid metal anode material in a fixed position with respect to the rotating anode support structure during operation. This approach offers the stability of a rotating solid anode approach with continuous repair of the anode surface of a liquid anode approach. This is described in more detail in U.S. Pat. No. 10,748,736 to Zalubovsky, and assigned to KLA-Tencor Corporation, the content of which is incorporated herein by reference in its entirety.

Although the embodiments described hereinbefore refer to a silicon emitter structure, in general, an electron emitter array may include a plurality of emitters fabricated from other materials, such as a metal emitter structure.

In a further aspect, a high radiance X-ray source based on an electron emitter array is employed as an X-ray source for a semiconductor metrology or inspection system. The high energy nature of x-ray radiation allows for the penetration of x-rays into optically opaque thin films, buried structures, high-aspect ratio structures and devices containing many thin film layers. Many x-ray metrology techniques used in semiconductor manufacturing benefit from a high radiance, reliable x-ray source, e.g., critical dimension small angle x-ray scattering (CD-SAXS).

Measurements often need long integration times due to the low scattering efficiency of materials comprising many modern semiconductor structures. A high radiance, high power, electron emitter array x-ray source improves the throughput of x-ray based measurements, e.g., CD-SAXS.

Figure 7:
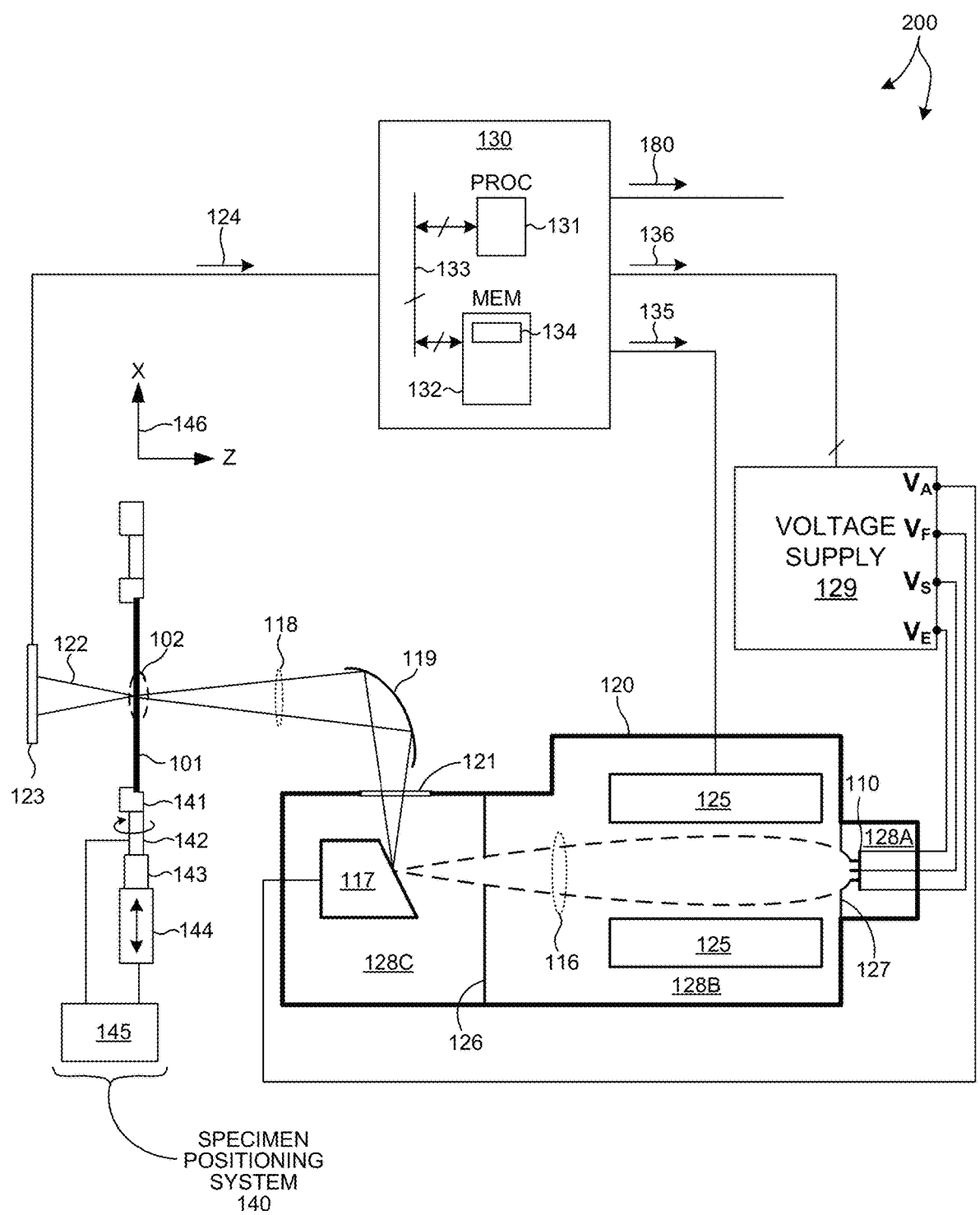
FIG. 7 is a diagram illustrative of an x-ray metrology system for performing semiconductor measurements including an electron emitter array x-ray illumination source in one embodiment.

FIG. 7 illustrates an embodiment of an x-ray based metrology system 200 including an electron emitter array x-ray illumination source in one embodiment. By way of non-limiting example, x-ray metrology system 200 operates in a transmission mode.

As depicted in FIG. 7, x-ray based metrology system 200 includes an electron emitter array x-ray illumination source as described with reference to FIG. 6. In the embodiment depicted in FIG. 7, computing system 130 is communicatively coupled to voltage supply 129. Voltage supply 129 generates voltages $V_A$, $V_F$, $V_S$, and $V_E$, in accordance with command signals 136 communicated to voltage supply 129 from computing system 130 indicating the desired voltage levels. In response, voltage supply 129 adjusts the voltage levels based on the command signals 136.

In the embodiment depicted in FIG. 7, the electron emitter array x-ray illumination source provides high radiance x-ray illumination delivered to a specimen 101 over an inspection area 102. X-ray metrology system 200 is configured such that x-rays which interact with the specimen 101 are collected by a detector 123 while a specimen positioning system 140 positions the specimen to produce angularly resolved interactions of the sample with the x-rays. In some embodiments, any other particles produced during the interaction such as photoelectrons, x-rays produced through fluorescence, or ions may also be detected.

In the embodiment depicted in FIG. 7, the electron emitter array x-ray illumination source includes electron optics 125 configured to shape the electron beam incident on anode 117. In the embodiment depicted in FIG. 7, electron optics 125 are communicatively coupled to computing system 130, and electron optics 125 are actively controlled based on command signals 135 communicated from computing system 130 to electron optics 125. In some examples, command signals 135 include an indication of a desired shape of the electron beam at the location of incidence at anode 117, a desired location of incidence at anode 117, a desired size of the electron beam at the location of incidence at anode 117, or any combination thereof. In response, electron optics 125 adjusts electron beam output to the desired value.

In some examples, current or voltage supplied to electromagnetic elements may be actively controlled based on command signals communicated from computing system 130 to electron optics 125. In another example, the position of a magnetic element (e.g., a permanent magnet) may be manipulated by a positioning system (not shown) based on command signals communicated from computing system 130 to electron optics 125. In this manner, the focusing and directing of the stream of electrons 116 is achieved under the control of computing system 130 to achieve a stable stream of electrons 116 incident on anode 117.

As depicted in FIG. 7, x-ray optics 119 are configured to collect x-ray emission from the spot of incidence of the stream of electrons 116 and anode 117 and shape and direct incident x-ray beam 118 to specimen 101.

In another aspect, x-ray optics 119 are configured at specific collection angles to capture x-ray emission in the desired energy band at peak intensity. In some embodiments, x-ray optics 119 are designed to directly focus x-ray radiation to the measurement target. When a high energy focused electron beam impinges upon an anode target, the stimulated x-ray emission includes broadband Bremsstrahlung radiation and characteristic line emission (i.e., Kα, Kβ, Lα, Lβ, etc.). In some embodiments, x-ray collection optics are oriented in such a way as to optimize x-ray brightness by collecting x-ray radiation over a range of collection angles.

In some examples, x-ray optics 119 monochromatize the x-ray beam that is incident on the specimen 101. In some examples, x-ray optics 119 collimate or focus the x-ray beam 118 onto inspection area 102 of specimen 101. In some embodiments, x-ray optics 119 includes one or more x-ray collimating mirrors, x-ray apertures, x-ray monochromators, and x-ray beam stops, multilayer optics, refractive x-ray optics, diffractive optics such as zone plates, or any combination thereof.

In some embodiments, advanced x-ray optics such as polycapillary x-ray optics, specular optics, or optics arranged in a Loxley-Tanner-Bowen configuration are employed to achieve high-brightness, small spot size illumination of a semiconductor specimen. For example, high intensity x-ray beams can be transported and focused to spot sizes of less than 40 micrometers using specular x-ray optics such as grazing incidence ellipsoidal mirrors, polycapillary optics such as hollow capillary x-ray waveguides, multilayer optics, or crystalline optics such as a Loxley-Tanner-Bowen system.

In preferred embodiments, x-ray optics 119 are multilayer optics. In some of these embodiments, multilayer optics are employed to monochromatize the x-ray beam 118 to a spectral purity, $\delta\lambda/\lambda$, of less than 10-1. This level of spectral purity is suitable for metrology technologies such as x-ray reflectivity (XRR), x-ray diffraction (XRD), and x-ray fluorescence (XRF). In some other embodiments, crystal monochromators are employed to monochromatize the x-ray beam 118 to a spectral purity, WA, of less than 10-6. This level of spectral purity is suitable for metrology technologies such as high resolution x-ray diffraction (HRXRD).

X-ray optics 119 may be configured for active control by computing system 130. In some embodiments, computing system 130 is communicatively coupled to x-ray optics 119 (not shown). In one example, command signals communicated to x-ray optics 119 from computing system 130 indicate a desired position of an optical element. The position of the optical element may be adjusted by a positioning system (not shown) based on the command signal. In this manner, the focusing and directing of the x-ray beam 118 is achieved under the control of computing system 130 to achieve a stable illumination incident on specimen 101. In some examples, computing system 130 is configured to control the positioning and spot size of the x-ray beam 118 incident on specimen 101. In some examples, computing system 130 is configured to control illumination properties of the x-ray beam 118 (e.g., intensity, polarization, spectrum, etc.).

As depicted in FIG. 7, x-ray detector 123 collects x-ray radiation 122 scattered from specimen 101 in response to the incident x-ray illumination and generates an output signal 124 indicative of properties of specimen 101 that are sensitive to the incident x-ray radiation. By way of non-limiting example, detector 123 is a silicon detector, a cadmium-telluride (CdTe) detector, or any other suitable detector. Scattered x-rays 122 are collected by x-ray detector 123 while specimen positioning system 140 locates and orients specimen 101 to produce angularly resolved scattered x-rays.

As depicted in FIG. 7, the electron emitter array x-ray source is maintained in a vacuum environment maintained within vacuum chamber 120. X-ray emission passes through vacuum window 121 as the x-rays propagate from anode 117 toward x-ray optics 119.

In some embodiments, the distance between specimen 101 and anode 117 is lengthy (e.g., greater than one meter). In these embodiments, air present in the beam path introduces undesirable beam scattering. Hence, in some embodiments it is preferred to propagate x-ray beam 118 through an evacuated flight tube from the electron emitter array illumination source to specimen 101.

In some embodiments, the x-ray detector 123 is maintained in the same atmospheric environment as specimen 101 (e.g., gas purge environment). However, in some embodiments, the distance between specimen 101 and x-ray detector 123 is lengthy (e.g., greater than one meter). In these embodiments, air present in the beam path introduces undesirable beam scattering, especially when the electron emitter array illumination source is configured to generate hard x-rays (e.g., photon energy greater than 5 keV). Hence in some embodiments, the x-ray detector 123 is maintained in a localized, vacuum environment separated from the specimen (e.g., specimen 101) by a vacuum window. In a preferred embodiment, the vacuum chamber includes a substantial portion of the path between specimen 101 and x-ray detector 123. The vacuum window may be constructed of any suitable material that is substantially transparent to x-ray radiation (e.g., Kapton, Beryllium, etc.). Scattered x-ray radiation 122 passes through the vacuum window, enters the vacuum chamber and is incident on x-ray detector 123. A suitable vacuum environment is maintained within vacuum chamber 170 to minimize disturbances to scattered x-ray radiation 122.

In some embodiments, it is desirable to maintain the x-ray illumination beam 118, specimen 101, the collection beam 122, and detector 123 in an evacuated environment to minimize absorption of x-rays. This is especially desirable if the electron emitter array illumination source is configured to generate soft x-rays (e.g., photon energy less than 5 keV).

In another aspect, x-ray measurements of a particular inspection area are performed at a number of different out of plane orientations. This increases the precision and accuracy of measured parameters and reduces correlations among parameters by extending the number and diversity of data sets available for analysis to include a variety of large-angle, out of plane orientations. Measuring specimen parameters with a deeper, more diverse data set also reduces correlations among parameters and improves measurement accuracy.

As illustrated in FIG. 7, x-ray metrology tool 200 includes a specimen positioning system 140 configured to both align specimen 101 and orient specimen 101 over a large range of out of plane angular orientations with respect the electron emitter array x-ray illumination source. In other words, specimen positioning system 140 is configured to rotate specimen 101 over a large angular range about one or more axes of rotation aligned in-plane with the surface of specimen 101. In some embodiments, specimen positioning system 140 is configured to rotate specimen 101 within a range of at least 90 degrees about one or more axes of rotation aligned in-plane with the surface of specimen 101. In some embodiments, specimen positioning system is configured to rotate specimen 101 within a range of at least 60 degrees about one or more axes of rotation aligned in-plane with the surface of specimen 101. In some other embodiments, specimen positioning system is configured to rotate specimen 101 within a range of at least one degree about one or more axes of rotation aligned in-plane with the surface of specimen 101. In this manner, angle resolved measurements of specimen 101 are collected by x-ray metrology system 200 over any number of locations on the surface of specimen 101. In one example, computing system 130 communicates command signals to motion controller 145 of specimen positioning system 140 that indicate the desired position of specimen 101. In response, motion controller 145 generates command signals to the various actuators of specimen positioning system 140 to achieve the desired positioning of specimen 101. By way of non-limiting example, a specimen positioning system may include any combination of a hexapod, linear, and angular stages.

By way of non-limiting example, as illustrated in FIG. 7, specimen positioning system 140 includes an edge grip chuck 141 to fixedly attach specimen 101 to specimen positioning system 140. A rotational actuator 142 is configured to rotate edge grip chuck 141 and the attached specimen 101 with respect to a perimeter frame 143. In the depicted embodiment, rotational actuator 142 is configured to rotate specimen 101 about the x-axis of the coordinate system 146 illustrated in FIG. 7. As depicted in FIG. 7, a rotation of specimen 101 about the z-axis is an in plane rotation of specimen 101. Rotations about the x-axis and the y-axis (not shown) are out of plane rotations of specimen 101 that effectively tilt the surface of the specimen with respect to the metrology elements of metrology system 200. Although it is not illustrated, a second rotational actuator is configured to rotate specimen 101 about the y-axis. A linear actuator 144 is configured to translate perimeter frame 143 in the x-direction. Another linear actuator (not shown) is configured to translate perimeter frame 143 in the y-direction. In this manner, every location on the surface of specimen 101 is available for measurement over a range of out of plane angular positions. For example, in one embodiment, a location of specimen 101 is measured over several angular increments within a range of −45 degrees to +45 degrees with respect to the normal orientation of specimen 101.

The large, out of plane, angular positioning capability of specimen positioning system 140 expands measurement sensitivity and reduces correlations between parameters. For example, in a normal orientation, SAXS is able to resolve the critical dimension of a feature, but is largely insensitive to sidewall angle and height of a feature. However, collecting measurement data over a broad range of out of plane angular positions enables the collection of measurement data associated with a number of diffraction orders. This enables the sidewall angle and height of a feature to be resolved. In addition, other features such as rounding or any other shapes associated with advanced structures can be resolved.

X-ray metrology tool 200 also includes computing system 130 employed to acquire signals 124 generated by x-ray detector 123 and determine properties of the specimen based at least in part on the acquired signals. As illustrated in FIG. 7, computing system 130 is communicatively coupled to x-ray detector 123. In one example, x-ray detector 123 is an x-ray spectrometer and measurement data 124 includes an indication of the measured spectral response of the specimen based on one or more sampling processes implemented by the x-ray spectrometer. Computing system 130 is configured to build models of the specimen, create x-ray simulations based upon the models, and analyze the simulations and signals 124 received from x-ray detector 123 to determine one or more characteristics of the sample (e.g., a value of a parameter of interest 180 of a structure under measurement).

In a further embodiment, computing system 130 is configured to access model parameters in real-time, employing Real Time Critical Dimensioning (RTCD), or it may access libraries of pre-computed models for determining a value of at least one specimen parameter value associated with the specimen 101. In general, some form of CD-engine may be used to evaluate the difference between assigned CD parameters of a specimen and CD parameters associated with the measured specimen. Exemplary methods and systems for computing specimen parameter values are described in U.S. Pat. No. 7,826,071, issued on Nov. 2, 2010, to KLA-Tencor Corp., the entirety of which is incorporated herein by reference.

In one example, measurement data 124 includes an indication of the measured x-ray response of the specimen. Based on the distribution of the measured x-ray response on the surface of detector 123, the location and area of incidence of x-ray beam 108 on specimen 101 is determined by computing system 130. In one example, pattern recognition techniques are applied by computing system 130 to determine the location and area of incidence of x-ray beam 118 on specimen 101 based on measurement data 124. In response computing system 130 generates command signals to any of electron optics 125 and x-ray optics 119 to redirect and reshape incident x-ray illumination beam 118.

Figure 8:
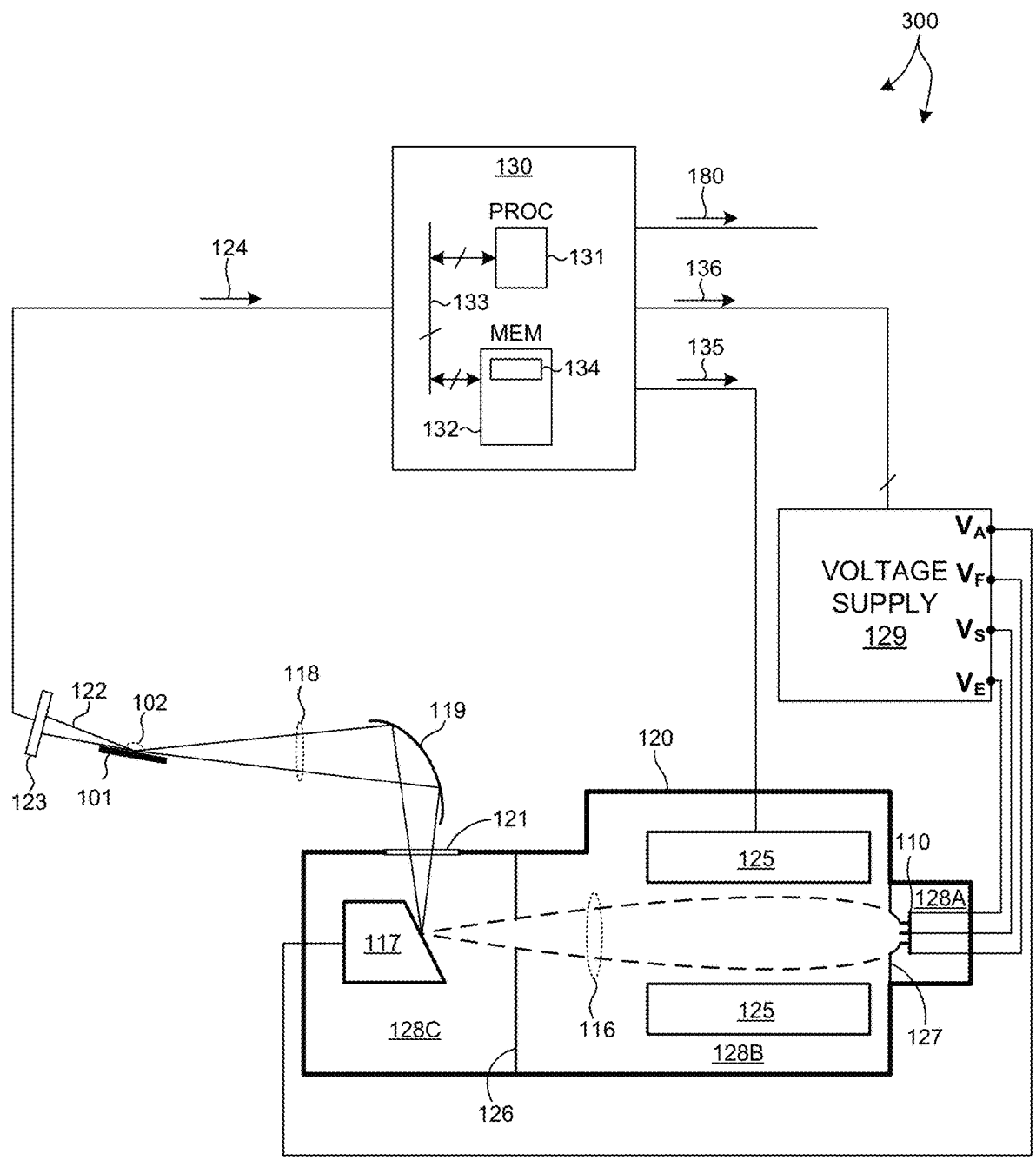
FIG. 8 is a diagram illustrative of an x-ray metrology system in for performing semiconductor measurements including an electron emitter array x-ray illumination source in another embodiment.

FIG. 8 illustrates an x-ray metrology system 300 for performing semiconductor metrology measurements. By way of non-limiting example, x-ray metrology system 300 operates in a grazing incidence mode. More specifically, x-ray metrology system 300 is configured as a grazing incidence small-angle x-ray scattering (GISAXS) measurement system. Typical angles of incidence and collection are approximately one degree as measured from the surface of the specimen, or approximately eighty nine degrees from an axis normal to the surface of the specimen. X-ray metrology system 300 includes an electron emitter array x-ray illumination source as described with reference to FIG. 6. As illustrated in FIG. 8, x-ray metrology system 300 includes similar, like numbered elements described with reference to FIG. 7. X-ray metrology system 300 is configured such that x-rays which are scattered from the specimen are collected by a detector while a sample handler (not shown) positions the specimen. In addition any other particles produced during the interaction such as photoelectrons, x-rays produced through fluorescence, or ions can be detected. Metrology systems configured to perform GISAXS measurements require a high brightness x-ray source to maintain sufficient brightness over the relatively large sample area illuminated at small angles. For this reason, an electron emitter array x-ray illumination source is particularly well suited for GISAXS measurements.

By way of non-limiting example, the x-ray metrology system 200 illustrated in FIG. 7 is configured as a transmission small angle x-ray scatterometer (TSAXS) and the x-ray metrology system 300 illustrated in FIG. 8 is configured as a grazing incidence small angle x-ray scatterometer (GISAXS). However, in general, an x-ray metrology system employing an electron emitter array x-ray illumination source as described herein may employ any one or more of the following metrology techniques: transmission small angle x-ray scattering (TSAXS), grazing incidence small angle x-ray scattering (GISAXS), wide angle x-ray scattering (WAXS), x-ray reflectometry (XRR), grazing incidence x-ray reflectometry (GXR), x-ray diffraction (XRD), grazing incidence x-ray diffraction (GIXRD), high resolution x-ray diffraction (HRXRD), x-ray photoelectron spectroscopy (XPS), x-ray fluorescence (XRF), total reflection x-ray fluorescence (TXRF), grazing incidence x-ray fluorescence (GIXRF), x-ray tomography, x-ray ellipsometry, and hard x-ray photoemission spectrometry (HXPS).

A x-ray metrology tool employing a high brightness electron emitter array x-ray source as described herein enables increased measurement sensitivity and throughput due to the high radiance and short wavelength radiation (e.g., photon energy greater than 500 eV) generated by the source. By way of non-limiting example, the x-ray metrology tool is capable of measuring geometric parameters (e.g., pitch, critical dimension (CD), side wall angle (SWA), line width roughness (LWR), and line edge roughness (LER)) of structures smaller than 10 nanometers. In addition, the high energy nature of x-ray radiation penetrates optically opaque thin films, buried structures, high aspect ratio structures, and devices including many thin film layers.

A x-ray metrology system employing a high brightness electron emitter array x-ray illumination source as described herein may be used to determine characteristics of semiconductor structures. Exemplary structures include, but are not limited to, FinFETs, low-dimensional structures such as nanowires or graphene, sub 10 nm structures, thin films, lithographic structures, through silicon vias (TSVs), memory structures such as DRAM, DRAM 4F2, FLASH and high aspect ratio memory structures. Exemplary structural characteristics include, but are not limited to, geometric parameters such as line edge roughness, line width roughness, pore size, pore density, side wall angle, profile, film thickness, critical dimension, pitch, and material parameters such as electron density, crystalline grain structure, morphology, orientation, stress, and strain.

An electron emitter array X-ray illumination source as described herein may be incorporated into any of the systems or methods described in U.S. Patent Publication No. 2016/0320319, entitled "Computationally Efficient X-ray Based Overlay Measurement" and filed by Hench et al. on Apr. 28, 2016, U.S. Patent Publication No. 2016/0202193, entitled "Measurement System Optimization For X-Ray Based Metrology" and filed by Hench et al. on Jan. 13, 2016, U.S. Patent Publication No. 2015/0117610, entitled "Methods And Apparatus For Measuring Semiconductor Device Overlay Using X-ray Metrology" and filed by Veldman et al. on Apr. 23, 2014, U.S. Patent Publication No. 2015/0110249, entitled "Small-Angle Scattering X-ray Metrology Systems And Methods" and filed by Bakeman et al. on Oct. 15, 2014, U.S. Patent Publication No. 2015/0051877, entitled "Metrology Tool With Combined XRF And SAXS Capabilities" and filed by Bakeman et al. on Aug. 17, 2014, U.S. Patent Publication No. 2015/0032398, entitled "Combined X-Ray and Optical Metrology" and filed by Peterlinz et al. on Nov. 7, 2013, U.S. Patent Publication No. 2014/0019097, entitled "Model Building And Analysis Engine For Combined X-ray And Optical Metrology" and filed by Bakeman et al. on Jul. 3, 2013, and U.S. Patent Publication No. 2013/0304424, entitled "Metrology Tool With Combined X-Ray And Optical Scatterometers" and filed by Bakeman et al. on May 5, 2013, the content of each of the aforementioned patent applications is incorporated herein by reference in its entirety.

Small-Angle X-Ray Scatterometry (SAXS) systems have shown promise to address challenging measurement applications. Various aspects of the application of SAXS technology to the measurement of critical dimensions (CD-SAXS) and overlay (OVL-SAXS) are described in 1) U.S. Pat. No. 7,929,667 to Zhuang and Fielden, entitled "High-brightness X-ray metrology," 2) U.S. Patent Publication No. 2014/0019097 by Bakeman, Shchegrov, Zhao, and Tan, entitled "Model Building And Analysis Engine For Combined X-Ray And Optical Metrology," 3) U.S. Patent Publication No. 2015/0117610 by Veldman, Bakeman, Shchegrov, and Mieher, entitled "Methods and Apparatus For Measuring Semiconductor Device Overlay Using X-Ray Metrology," 4) U.S. Patent Publication No. 2016/0202193 by Hench, Shchegrov, and Bakeman, entitled "Measurement System Optimization For X-Ray Based Metrology," 5) U.S. Patent Publication No. 2017/0167862 by Dziura, Gellineau, and Shchegrov, entitled "X-ray Metrology For High Aspect Ratio Structures," and 6) U.S. Patent Publication No. 2018/0106735 by Gellineau, Dziura, Hench, Veldman, and Zalubovsky, entitled "Full Beam Metrology for X-Ray Scatterometry Systems." The aforementioned patent documents are assigned to KLA-Tencor Corporation, Milpitas, Calif. (USA), and the content of each of the aforementioned patent applications is incorporated herein by reference in its entirety.

Research on CD-SAXS metrology of semiconductor structures is also described in scientific literature. Most research groups have employed high-brightness X-ray synchrotron sources which are not suitable for use in a semiconductor fabrication facility due to their immense size, cost, etc. One example of such a system is described in the article entitled "Intercomparison between optical and x-ray scatterometry measurements of FinFET structures" by Lemaillet, Germer, Kline et al., Proc. SPIE, v. 8681, p. 86810Q (2013). More recently, a group at the National Institute of Standards and Technology (NIST) has initiated research employing compact and bright X-ray sources similar those described in U.S. Pat. No. 7,929,667. This research is described in an article entitled "X-ray scattering critical dimensional metrology using a compact x-ray source for next generation semiconductor devices," J. Micro/Nanolith. MEMS MOEMS 16(1), 014001 (January-March 2017).

SAXS has also been applied to the characterization of materials and other non-semiconductor related applications. Exemplary systems have been commercialized by several companies, including Xenocs SAS (www.xenocs.com), Bruker Corporation (www.bruker.com), and Rigaku Corporation (www.rigaku.com/en).

It should be recognized that the various steps described throughout the present disclosure may be carried out by a single computer system 130 or, alternatively, a multiple computer system 130. Moreover, different subsystems of the systems 200 and 200, such as the electron emitter array x-ray source 115, may include a computer system suitable for carrying out at least a portion of the steps described herein. Therefore, the aforementioned description should not be interpreted as a limitation on the present invention but merely an illustration. Further, the one or more computing systems 130 may be configured to perform any other step(s) of any of the method embodiments described herein.

In addition, the computer system 130 may be communicatively coupled to the x-ray detector 123, electron optics 125, x-ray optics 119, electron emitter array 110, anode 117, and specimen positioning system 140 in any manner known in the art. For example, the one or more computing systems 130 may be coupled to computing systems associated with x-ray detector 123, electron optics 125, x-ray optics 119, electron emitter array 110, anode 117, and specimen positioning system 140, respectively. In another example, any of x-ray detector 123, electron optics 125, x-ray optics 119, electron emitter array 110, anode 117, and specimen positioning system 140 may be controlled directly by a single computer system coupled to computer system 130.

The computer system 130 of the x-ray metrology systems 200 and 300 may be configured to receive and/or acquire data or information from the subsystems of the system (e.g., x-ray detector 123, electron optics 125, x-ray optics 119, electron emitter array 110, anode 117, and specimen positioning system 140, and the like) by a transmission medium that may include wireline and/or wireless portions. In this manner, the transmission medium may serve as a data link between the computer system 130 and other subsystems of the systems 200 and 300.

Computer system 130 of the metrology systems 200 and 300 may be configured to receive and/or acquire data or information (e.g., measurement results, modeling inputs, modeling results, etc.) from other systems by a transmission medium that may include wireline and/or wireless portions. In this manner, the transmission medium may serve as a data link between the computer system 130 and other systems (e.g., memory on-board metrology systems 200 and 300, external memory, or external systems). For example, the computing system 130 may be configured to receive measurement data (e.g., output signals 124) from a storage medium (i.e., memory 132) via a data link. For instance, spectral results obtained using a spectrometer of x-ray detector 123 may be stored in a permanent or semi-permanent memory device (e.g., memory 132). In this regard, the spectral results may be imported from on-board memory or from an external memory system. Moreover, the computer system 130 may send data to other systems via a transmission medium. For instance, specimen parameter values 180 determined by computer system 130 may be stored in a permanent or semi-permanent memory device. In this regard, measurement results may be exported to another system.

Computing system 130 may include, but is not limited to, a personal computer system, mainframe computer system, workstation, image computer, parallel processor, or any other device known in the art. In general, the term "computing system" may be broadly defined to encompass any device having one or more processors, which execute instructions from a memory medium.

Program instructions 134 implementing methods such as those described herein may be transmitted over a transmission medium such as a wire, cable, or wireless transmission link. For example, as illustrated in FIG. 1, program instructions stored in memory 132 are transmitted to processor 131 over bus 133. Program instructions 134 are stored in a computer readable medium (e.g., memory 132). Exemplary computer-readable media include read-only memory, a random access memory, a magnetic or optical disk, or a magnetic tape.

In some embodiments, x-ray metrology as described herein is implemented as part of a fabrication process tool. Examples of fabrication process tools include, but are not limited to, lithographic exposure tools, film deposition tools, implant tools, and etch tools. In this manner, the results of x-ray measurements are used to control a fabrication process. In one example, x-ray measurement data collected from one or more targets is sent to a fabrication process tool. The x-ray data is analyzed and the results used to adjust the operation of the fabrication process tool.

Figure 9:
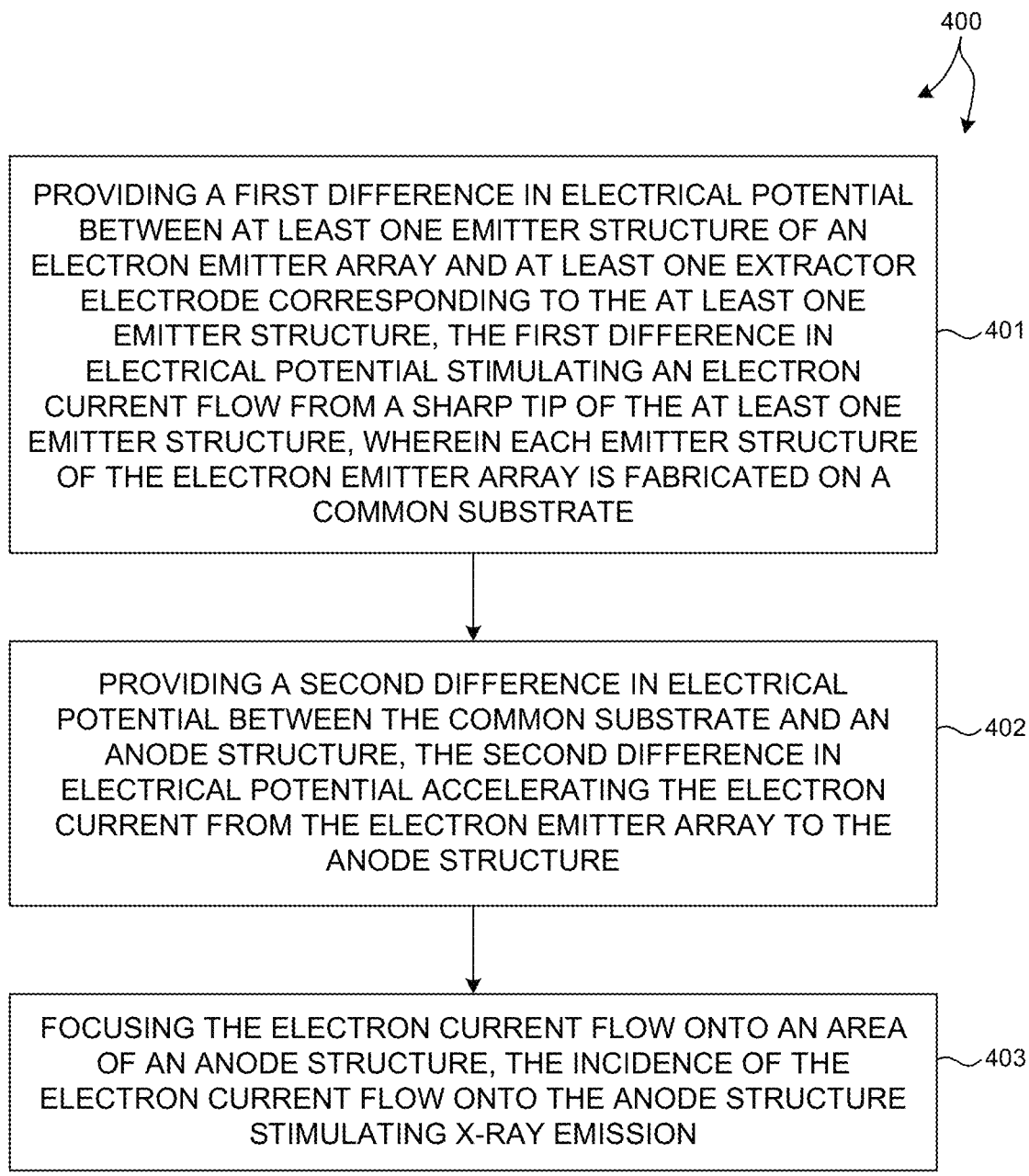
FIG. 9 is a flowchart illustrative of an exemplary method suitable for generating x-ray emission from an electron emitter array x-ray illumination source.

FIG. 9 illustrates a method 400 suitable for implementation by the x-ray metrology systems 200 and 300 of the present invention. In one aspect, it is recognized that any data processing elements of method 400 may be carried out via a pre-programmed algorithm executed by one or more processors of computing system 130. While the following description is presented in the context of x-ray metrology systems 200 and 300, it is recognized herein that the particular structural aspects of x-ray metrology systems 200 and 300 do not represent limitations and should be interpreted as illustrative only.

In block 401, a first difference in electrical potential is provided between at least one emitter structure of an electron emitter array and at least one extractor electrode corresponding to the at least one emitter structure. The first difference in electrical potential stimulates an electron current flow from a sharp tip of the at least one emitter structure. Each emitter structure of the electron emitter array is fabricated on a common substrate.

In block 402, a second difference in electrical potential is provided between the common substrate and an anode structure. The second difference in electrical potential accelerates the electron current from the electron emitter array to the anode structure.

In block 403, the electron current flow is focused onto an area of an anode structure. The incidence of the electron current flow onto the anode structure stimulates X-ray emission.

As described herein, the term "critical dimension" includes any critical dimension of a structure (e.g., bottom critical dimension, middle critical dimension, top critical dimension, sidewall angle, grating height, etc.), a critical dimension between any two or more structures (e.g., distance between two structures), and a displacement between two or more structures (e.g., overlay displacement between overlaying grating structures, etc.). Structures may include three dimensional structures, patterned structures, overlay structures, etc.

As described herein, the term "critical dimension application" or "critical dimension measurement application" includes any critical dimension measurement.

As described herein, the term "metrology system" includes any system employed at least in part to characterize a specimen in any aspect, including critical dimension applications and overlay metrology applications. However, such terms of art do not limit the scope of the term "metrology system" as described herein. In addition, the metrology system 100 may be configured for measurement of patterned wafers and/or unpatterned wafers. The metrology system may be configured as a LED inspection tool, edge inspection tool, backside inspection tool, macro-inspection tool, or multi-mode inspection tool (involving data from one or more platforms simultaneously), and any other metrology or inspection tool that benefits from a liquid droplet x-ray source.

Various embodiments are described herein for a semiconductor processing system (e.g., an inspection system or a lithography system) that may be used for processing a specimen. The term "specimen" is used herein to refer to a wafer, a reticle, or any other sample that may be processed (e.g., printed or inspected for defects) by means known in the art.

As used herein, the term "wafer" generally refers to substrates formed of a semiconductor or non-semiconductor material. Examples include, but are not limited to, monocrystalline silicon, gallium arsenide, and indium phosphide. Such substrates may be commonly found and/or processed in semiconductor fabrication facilities. In some cases, a wafer may include only the substrate (i.e., bare wafer). Alternatively, a wafer may include one or more layers of different materials formed upon a substrate. One or more layers formed on a wafer may be "patterned" or "unpatterned." For example, a wafer may include a plurality of dies having repeatable pattern features.

A "reticle" may be a reticle at any stage of a reticle fabrication process, or a completed reticle that may or may not be released for use in a semiconductor fabrication facility. A reticle, or a "mask," is generally defined as a substantially transparent substrate having substantially opaque regions formed thereon and configured in a pattern. The substrate may include, for example, a glass material such as amorphous SiO2. A reticle may be disposed above a resist-covered wafer during an exposure step of a lithography process such that the pattern on the reticle may be transferred to the resist.

One or more layers formed on a wafer may be patterned or unpatterned. For example, a wafer may include a plurality of dies, each having repeatable pattern features. Formation and processing of such layers of material may ultimately result in completed devices. Many different types of devices may be formed on a wafer, and the term wafer as used herein is intended to encompass a wafer on which any type of device known in the art is being fabricated.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a general purpose or special purpose computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

Although certain specific embodiments are described above for instructional purposes, the teachings of this patent document have general applicability and are not limited to the specific embodiments described above. Accordingly, various modifications, adaptations, and combinations of various features of the described embodiments can be practiced without departing from the scope of the invention as set forth in the claims.

What is claimed is:

1. An x-ray illumination source, comprising:
   an electron emitter array including a plurality of electron emitters each fabricated on a common substrate, each of the plurality of electron emitters comprising:
      an emitter structure fabricated on the common substrate, the emitter structure extending from a surface plane of the common substrate in a direction normal to the surface plane, the emitter structure terminating at a sharp tip of the emitter structure;
      an extractor electrode fabricated around the sharp tip of the emitter structure, wherein a void separates the emitter tip and at least a portion of the extractor electrode; and
      a first insulating layer disposed between the emitter structure and the extractor electrode, wherein the first insulating layer electrically isolates the emitter structure from the extractor electrode, wherein a difference in electrical potential between the emitter structure and the extractor electrode stimulates an electron current flow from the sharp tip of the emitter structure;
   an anode structure spatially separated from the electron emitter array, wherein a difference in electrical potential between the anode structure and the substrate accelerates the electron current flow from each of the plurality of electron emitters of the electron emitter array to the anode, wherein the incidence of the electron current flow onto the anode structure stimulates X-ray emission from the anode structure;
   an electron lens located around a path of the electron current flow from the electron emitter array to the anode structure;
   a first barrier separating a first portion of a vacuum chamber and a second portion of the vacuum chamber, wherein the electron emitter array is disposed in the first portion of the vacuum chamber and the electron lens is disposed in the second portion of the vacuum chamber, and wherein the first portion of the vacuum chamber is maintained at a lower pressure than the second portion of the vacuum chamber; and
   a second barrier separating a third portion of the vacuum chamber and the second portion of the vacuum chamber, wherein the anode structure is disposed in the third portion of the vacuum chamber, wherein the second portion of the vacuum chamber is maintained at a lower pressure than the third portion of the vacuum chamber.

2. The x-ray illumination source of claim 1, wherein the current density of the electron current flow generated across the electron emitter array is at least 0.01 Ampere/mm2.

3. The x-ray illumination source of claim 2,
   wherein the electron lens is configured to focus the electron current flow onto an area of the anode structure characterized by a dimension of maximum extent of less than 100 micrometers.

4. The x-ray illumination source of claim 1, wherein the common substrate is a silicon substrate.

5. The x-ray illumination source of claim 1, wherein a spacing between adjacent emitter structures of the electron emitter array is less than five micrometers.

6. The x-ray illumination source of claim 1, wherein a first subset of the extractor electrodes are electrically isolated from a second subset of the extractor electrodes, and wherein a first electrical potential is present on the first subset of extractor electrodes, and wherein a second electrical potential is present on the second subset of extractor electrodes, wherein the first electrical potential is different from the second electrical potential.

7. The x-ray illumination source of claim 1, each of the plurality of electron emitters, further comprising:
   a focusing electrode fabricated around the sharp tip of the emitter structure over the extractor electrode; and
   a second insulating layer disposed between the focusing electrode and the extractor electrode, wherein the second insulating layer electrically isolates the focusing electrode from the extractor electrode, wherein a difference in electrical potential between the emitter structure and the focusing electrode shapes the electron current flow from the sharp tip of the emitter structure.

8. The x-ray illumination source of claim 1, further comprising:
   an optical light source configured to illuminate the electron emitter array with optical radiation, wherein the optical illumination enhances electron emission from the electron emitter array.

9. The x-ray illumination source of claim 1, wherein the difference in electrical potential between the anode structure and the substrate is less than four times the energy of a desired X-ray emission line generated by the anode structure.

10. The x-ray illumination source of claim 1, wherein a temperature of the electron emitter array is maintained in a range between 400 and 1,000 degrees Centigrade.

11. The x-ray illumination source of claim 1, wherein the first barrier includes an aperture, and wherein the electron current flow passes through the aperture.

12. The x-ray illumination source of claim 1, wherein the first barrier includes an opening covered by a thin, metal foil, and wherein the electron current flow passes through the thin, metal foil.

13. The x-ray illumination source of claim 1, wherein the anode structure includes an anode material, wherein the electron current flow is incident on the anode material, and wherein the anode material is any of copper, molybdenum, and tungsten.

14. The x-ray illumination source of claim 1, wherein the anode structure includes an anode material, wherein the electron current flow is incident on the anode material, and wherein the anode material is a solid metal or a liquid metal.

15. The x-ray illumination source of claim 1, wherein the anode structure includes a rotating anode support structure configured to rotate about an axis of rotation at a constant angular velocity, wherein the rotating anode support structure supports a metal anode material in a fixed position with respect to the rotating anode support structure while the rotating anode support structure is rotated at the constant angular velocity, and wherein the electron current is incident on the metal anode, and wherein the metal anode is a solid metal anode or a liquid metal anode.

16. A measurement system, comprising:
an electron emitter array based x-ray illumination source configured to illuminate an area of a specimen with an incident x-ray beam, wherein the electron emitter based x-ray illumination source includes,
an electron emitter array including a plurality of electron emitters each fabricated on a common substrate, each of the plurality of electron emitters comprising:
an emitter structure fabricated on the common substrate, the emitter structure terminating at a sharp tip;
an extractor electrode fabricated around the sharp tip of the emitter structure, wherein a void separates the emitter tip and at least a portion of the extractor electrode; and
a first insulating layer disposed between the emitter structure and the extractor electrode, wherein the first insulating layer electrically isolates the emitter structure from the extractor electrode, wherein a difference in electrical potential between the emitter structure and the extractor electrode stimulates an electron current flow from the sharp tip of the emitter structure; and
an anode structure spatially separated from the electron emitter array, wherein a difference in electrical potential between the anode structure and the substrate accelerates the electron current flow from each of the plurality of electron emitters of the electron emitter array to the anode, wherein the incidence of the electron current flow onto the anode structure stimulates X-ray emission from the anode structure;
an x-ray detector configured to receive radiation from the specimen in response to the incident x-ray beam and generate signals indicative of a first property of the specimen;
an electron lens located around a path of the electron current flow from the electron emitter array to the anode structure;
a first barrier separating a first portion of a vacuum chamber and a second portion of the vacuum chamber, wherein the electron emitter array is disposed in the first portion of the vacuum chamber and the electron lens is disposed in the second portion of the vacuum chamber, and wherein the first portion of the vacuum chamber is maintained at a lower pressure than the second portion of the vacuum chamber; and
a second barrier separating a third portion of the vacuum chamber and the second portion of the vacuum chamber, wherein the anode structure is disposed in the third portion of the vacuum chamber, wherein the second portion of the vacuum chamber is maintained at a lower pressure than the third portion of the vacuum chamber.

17. The measurement system of claim 16, wherein the measurement system is a small angle x-ray scatterometer configured to perform measurements in a transmissive or a reflective mode.

18. The measurement system of claim 16, wherein the measurement system is configured as any of a transmission small angle x-ray scatterometry system, a grazing incidence small angle x-ray scatterometry system, a wide angle x-ray scatterometry system, a x-ray reflectometry system, a grazing incidence x-ray reflectometry system, a x-ray diffractometry system, a grazing incidence x-ray diffractometry system, a high resolution x-ray diffractometery system, a x-ray photoelectron spectrometry system, a x-ray fluorescence metrology system, a total reflection x-ray fluorescence metrology system, a grazing incidence x-ray fluorescence metrology system, a x-ray tomography system, a x-ray ellipsometry system, and a hard x-ray photoemission spectrometry system.

19. The measurement system of claim 16, wherein the current density of the electron current flow generated across the electron emitter array is at least 0.01 Ampere/mm2.

20. The measurement system of claim 16, wherein the electron lens is configured to focus the electron current flow onto an area of the anode structure characterized by a dimension of maximum extent of less than 100 micrometers.

21. The measurement system of claim 16, wherein the common substrate is a silicon substrate.

22. The measurement system of claim 16, wherein a spacing between adjacent emitter structures of the electron emitter array is less than five micrometers.

23. The measurement system of claim 16, wherein a first subset of the extractor electrodes are electrically isolated from a second subset of the extractor electrodes, and wherein a first electrical potential is present on the first subset of extractor electrodes, and wherein a second electrical potential is present on the second subset of extractor electrodes, wherein the first electrical potential is different from the second electrical potential.

24. The measurement system of claim 16, each of the plurality of electron emitters, further comprising:
a focusing electrode fabricated around the sharp tip of the emitter structure over the extractor electrode; and
a second insulating layer disposed between the focusing electrode and the extractor electrode, wherein the second insulating layer electrically isolates the focusing electrode from the extractor electrode, wherein a difference in electrical potential between the emitter structure and the focusing electrode shapes the electron current flow from the sharp tip of the emitter structure.

25. The measurement system of claim 16, the electron emitter based x-ray illumination source further comprising:
an optical light source configured to illuminate the electron emitter array with optical radiation, wherein the optical illumination enhances electron emission from the electron emitter array.

26. The measurement system of claim 16, wherein the difference in electrical potential between the anode structure and the substrate is less than four times the energy of a desired X-ray emission line generated by the anode structure.

27. The measurement system of claim 16, wherein a temperature of the electron emitter array is maintained in a range between 400 and 1,000 degrees Centigrade.

28. The measurement system of claim 16, wherein the anode structure includes an anode material, wherein the electron current flow is incident on the anode material, and wherein the anode material is a solid metal or a liquid metal.

29. A method comprising:
providing a first difference in electrical potential between at least one emitter structure of an electron emitter array and at least one extractor electrode corresponding to the at least one emitter structure, the first difference in electrical potential stimulating an electron current flow from a sharp tip of the at least one emitter structure, wherein each emitter structure of the electron emitter array is fabricated on a common substrate;

providing a second difference in electrical potential between the common substrate and an anode structure, the second difference in electrical potential accelerating the electron current flow from the electron emitter array to the anode structure;

focusing the electron current flow onto an area of an anode structure with an electron lens disposed in a path of the electron current between the electron emitter array and the anode structure, the incidence of the electron current flow onto the anode structure stimulating X-ray emission;

maintaining a vacuum in a first portion of a vacuum chamber, wherein the electron emitter array is disposed in the first portion of the vacuum chamber;

maintaining a vacuum in a second portion of the vacuum chamber, wherein the electron lens is disposed in the second portion of the vacuum chamber, and wherein the vacuum maintained in the first portion of the vacuum chamber is a lower pressure than the vacuum maintained in the second portion of the vacuum chamber; and maintaining a vacuum in a third portion of the vacuum chamber, wherein the anode structure is disposed in the third portion of the vacuum chamber, and wherein the vacuum maintained in the second portion of the vacuum chamber is a lower pressure than the vacuum maintained in the third portion of the vacuum chamber.

30. The method of claim 29, further comprising:
illuminating an area of a specimen with an incident x-ray beam comprising the X-ray emission from the anode structure;

detecting an amount of radiation from the specimen in response to the incident X-ray beam; and generating signals indicative of a first property of the specimen based on the detected amount of radiation.

31. The method of claim 29, wherein a current density of the electron current flow generated across the electron emitter array is at least 0.01 Ampere/mm2.

32. The method of claim 29, wherein the area of the anode structure upon which the electron current flow is focused is characterized by a dimension of maximum extent of less than 100 micrometers.

33. The method of claim 29, wherein the common substrate is a silicon substrate.

34. The method of claim 29, wherein a spacing between adjacent emitter structures of the electron emitter array is less than five micrometers.

* * * * *